(12) United States Patent
Jauregui et al.

(10) Patent No.: US 12,727,209 B2
(45) Date of Patent: Sep. 1, 2026

(54) COMBINED CHARGE BALANCE AND EDGE TERMINATION SURFACE PASSIVATION FOR A SEMICONDUCTOR DEVICE AND METHODS OF FABRICATING THE SAME

(71) Applicant: IDEAL SEMICONDUCTOR DEVICES, INC., Bethlehem, PA (US)

(72) Inventors: David Jauregui, Bethlehem, PA (US); Stanislav Soloviev, Breinigsville, PA (US); Philip Rutter, Bethlehem, PA (US)

(73) Assignee: IDEAL SEMICONDUCTOR DEVICES, INC., Bethlehem, PA (US)

( * ) Notice: Subject to any disclaimer, the term of this patent is extended or adjusted under 35 U.S.C. 154(b) by 388 days.

(21) Appl. No.: 18/464,686

(22) Filed: Sep. 11, 2023

(65) Prior Publication Data

US 2024/0145532 A1 May 2, 2024

Related U.S. Application Data

(60) Provisional application No. 63/420,339, filed on Oct. 28, 2022.

(51) Int. Cl.

*H10D 62/10* (2025.01)
*H10W 29/00* (2026.01)
*H10W 42/80* (2026.01)

(52) U.S. Cl.

CPC .......... *H10D 62/105* (2025.01); *H10W 29/00* (2026.01); *H10W 29/01* (2026.01); *H10W 42/80* (2026.01)

(58) Field of Classification Search

CPC .. H10D 62/105; H10D 30/665; H10D 30/668; H10D 64/118; H10D 62/115; H10D 62/112

See application file for complete search history.

(56) References Cited

U.S. PATENT DOCUMENTS

| | | | |
|---|---|---|---|
| 9,620,585 | B1 | 4/2017 | Loechelt et al. |
| 2005/0242411 | A1 | 11/2005 | Tso |

(Continued)

OTHER PUBLICATIONS

Hossain et al. "3-D TCAD simulation to optimize the trench termination design for higher and robust BVdss" 2016 28th International Symposium on Power Semiconductor Devices and ICs (Jun. 2016).

(Continued)

*Primary Examiner* — Syed I Gheyas
(74) *Attorney, Agent, or Firm* — Myers Bigel, P.A.

(57) ABSTRACT

A semiconductor device is provided that includes an epitaxial layer disposed on a semiconductor substrate, the epitaxial layer including an active region, in which at least one active element is formed, and an edge termination region, in which at least one edge termination structure is formed, the edge termination region being laterally adjacent to the active region. The semiconductor device further includes a charged layer disposed on an upper surface of the epitaxial layer, the charged layer covering at least a portion of the active region and extending laterally over at least a portion of the edge termination region. Active trenches may be formed in the active region, and at least one edge trench may be formed in the edge termination region. The charged layer may be formed on sidewalls of each of the active trenches and the edge trench using atomic layer deposition in a same processing step.

30 Claims, 11 Drawing Sheets

(56) References Cited

U.S. PATENT DOCUMENTS

| | | | | |
|---|---|---|---|---|
| 2012/0187526 | A1 | 7/2012 | Roig-guitart et al. | |
| 2012/0286355 | A1 | 11/2012 | Mauder et al. | |
| 2013/0009277 | A1 | 1/2013 | Dube et al. | |
| 2013/0334653 | A1 * | 12/2013 | Hirler | H10D 30/668 257/506 |
| 2017/0250173 | A1 | 8/2017 | Yilmaz | |
| 2017/0250257 | A1 | 8/2017 | Yang et al. | |
| 2018/0114852 | A1 | 4/2018 | Tipirneni et al. | |
| 2019/0115436 | A1 | 4/2019 | Hossain et al. | |
| 2019/0237575 | A1 * | 8/2019 | Mauder | H10D 62/106 |
| 2021/0028305 | A1 * | 1/2021 | Hsieh | H10D 30/0297 |
| 2022/0254886 | A1 | 8/2022 | Pal et al. | |

OTHER PUBLICATIONS

Noblecourt et al. "An Improved Junction Termination Design Using Deep Trenches for Superjunction Power Devices" 2015 22nd International Conference Mixed Design of Integrated Circuits & Systems (Jun. 2015).

Seto et al. "Universal trench edge termination design" 2012 24th International Symposium on Power Semiconductor Devices and ICs (Jun. 2012).

Theolier et al. "A New Junction Termination Using a Deep Trench Filled with BenzoCycloButene" IEEE Electron Device Letters 30(6):687-689 (Jun. 2009).

Wang et al. "Trench Termination with SiO2-Encapsulated Dielectric for Near-Ideal Breakdown Voltage in 4H—SiC Devices" IEEE Electron Device Letters 39(12):1900-1903 (Dec. 2018).

Yamaguchi et al. "High aspect ratio deep trench termination (HARDT2) technique surrounding die edge as dielectric wall to improve high voltage device area efficiency" 2017 29th International Symposium on Power Semiconductor Devices and IC's (May 2017).

Yang et al. "A Novel Sloped Field Plate-Enhanced Ultra-Short Edge Termination Structure" IEEE Electron Device Letters 37(4):471-473 (Apr. 2016).

Yang et al. "Design and Characterization of Sloped-Field-Plate Enhanced Trench Edge Termination" IEEE Transactions On Electron Devices 64(3):728-734 (Mar. 2017).

Srikanth et al. "Charge Sheet Superjunction (CSSJ)—A New Superjunction Concept" 2007 International Workshop on Physics of Semiconductor Devices (pp. 795-798) (2007).

Notification of Transmittal of the International Search Report and the Written Opinion of the International Searching Authority, or the Declaration, in corresponding PCT Application No. PCT/US2023/077993 (Mar. 25, 2024).

* cited by examiner

COMBINED CHARGE BALANCE AND EDGE TERMINATION SURFACE PASSIVATION FOR A SEMICONDUCTOR DEVICE AND METHODS OF FABRICATING THE SAME

CROSS-REFERENCE TO RELATED APPLICATION(S)

This application claims priority under 35 U.S.C. § 119 to U.S. Provisional Application No. 63/420,339, filed on Oct. 28, 2022, the disclosure of which is incorporated by reference herein in its entirety for all purposes.

BACKGROUND

The present invention relates generally to semiconductor devices and fabrication, and, more particularly, to enhanced charge balance and edge termination structures for use in a semiconductor device, and methods of fabricating such structures.

One or more vertically conducting semiconductor devices in an integrated circuit (IC) often include an active region that is surrounded by an edge termination region. In such vertical devices, the edge of the die is invariably at the same or similar voltage potential as that of a bottom of the device due primarily to saw damage when the device is singulated, or lack of a blocking junction at the edge of the device. Therefore, an edge termination region is an important part of the device design to ensure lateral blocking of potentially damaging voltages between the active region and the edge of the die.

In conventional planar edge termination schemes for vertical devices, one important objective is to ensure a gradual change in the electric field along a length of the edge termination region to maximize breakdown voltage in the device. Several mechanisms have been employed in an attempt to achieve this objective, including the use of various doping arrangements at the surface of the device (e.g., junction termination extension (JTE), an implant on the surface of the device), passivation films (e.g., semi-insulating polycrystalline silicon (SIPOS), a high-resistance conducting film) on the surface of the device, and metal field plates. (See, e.g., Baliga, B. J. (2019), "Fundamentals of Power Semiconductor Devices," Chapter 3: Breakdown Voltage, Springer Cham, pp. 89-170, September 2018, and J. Lutz, et al., "Semiconductor Power Devices: Physics, Characteristics, Reliability," Springer Cham, February 2018, the disclosures of which are incorporated by reference herein in their entireties).

Unfortunately, however, these conventional planar edge termination schemes typically involve the inclusion of additional surface layers formed on existing structures and/or layers required to fabricate an active device, which can undesirably increase processing costs and complexity, and potentially reduce reliability and/or device yield.

SUMMARY

The present invention, as manifested in one or more embodiments, beneficially provides illustrative edge termination structures in a semiconductor device configured to withstand a blocking voltage in both lateral and vertical directions, and methods for fabricating such structures. The novel edge termination structures according to embodiments of the present disclosure are suitable for use in a charge balanced semiconductor device, and may have beneficial application, for example, in a power device or power system, among other applications.

In accordance with an embodiment, a semiconductor device is provided that includes an epitaxial layer disposed on a semiconductor substrate, the epitaxial layer including an active region, in which at least one active element is formed, and an edge termination region, in which at least one edge termination structure is formed, the edge termination region being laterally adjacent to the active region. The semiconductor device further includes a charged layer disposed on an upper surface of the epitaxial layer, the charged layer covering at least a portion of the active region and extending laterally over at least a portion of the edge termination region. Active trenches may be formed in the active region, and at least one edge trench may be formed in the edge termination region. The charged layer may be formed on sidewalls of each of the active trenches and the edge trench using atomic layer deposition in a same processing step.

In accordance with an embodiment of the invention, a method of forming an edge termination structure in a semiconductor device is provided, the semiconductor device including an active region, in which one or more active structures are formed, and an edge termination region, in which the edge termination structure is formed, the edge termination region being laterally adjacent to the active region. The method includes: forming an epitaxial layer on a semiconductor substrate, the epitaxial layer including an active region, in which at least one active element is formed, and an edge termination region, in which at least one edge termination structure is formed, the edge termination region being laterally adjacent to the active region; and forming a charged layer on an upper surface of the epitaxial layer, the charged layer covering at least a portion of the active region and extending laterally over at least a portion of the edge termination region. The method may include forming active trenches in the active region, and at least one edge trench may be formed in the edge termination region. The method may include forming the charged layer on sidewalls of each of the active trenches and the edge trench using atomic layer deposition in a same processing step.

In accordance with an embodiment of the invention, a method of forming an edge termination structure in a semiconductor device is provided, the semiconductor device including an active region, in which one or more active structures are formed, and an edge termination region, in which the edge termination structure is formed, the edge termination region being laterally adjacent to the active region. The method includes: forming an epitaxial layer on a semiconductor substrate, the epitaxial layer extending laterally across the active and edge termination regions; forming a plurality of active trenches in the active region and at least one edge trench in the edge termination region, each of the at least one edge trench and the plurality of active trenches extending vertically through at least a portion of the epitaxial layer; forming a first charged layer on at least exposed sidewalls of each of the active trenches and the at least one edge trench in a same processing step; and at least partially filling each of the at least one edge trench and the plurality of active trenches with a fill material in a same processing step to form a trench fill layer.

As the term may be used herein, "facilitating" an action includes performing the action, making the action easier, helping to carry the action out, or causing the action to be performed. Thus, by way of example only and without limitation, in the context of a semiconductor fabrication process, instructions executing on one machine for performing a particular action in fabricating a semiconductor device might facilitate an action carried out by instructions executing on a different machine, such as by sending appropriate data or commands to cause or aid the action to be performed. For the avoidance of doubt, where an actor facilitates an action by other than directly performing the action, the action is nevertheless performed by some entity or combination of entities.

Techniques of the present invention can provide substantial beneficial technical effects. By way of example only and without limitation, techniques according to embodiments of the invention may provide one or more of the following advantages, among other benefits:

- achieves effective surface passivation (i.e., minimizes surface defects and interface traps) of an edge termination region in the device by utilizing the same charged film that is used to create the charge balance region in the device;
- provides a compact edge termination region that minimizes additional semiconductor area consumption;
- minimizes additional process steps, thereby reducing overall cost and fabrication complexity and improving yield;
- provides an edge termination region that achieves a breakdown voltage consistent with or greater than that of the active region, and can withstand a blocking voltage in both the lateral and vertical direction;
- compatible with other edge termination features that are used to improve an effectiveness of edge termination structures, including, for example, inner field plates, outer field plates, junction termination extensions (JTEs), variable lateral diffusion (VLD), and charged or resistive layer on surface;
- maximizes the breakdown voltage of the edge termination region.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
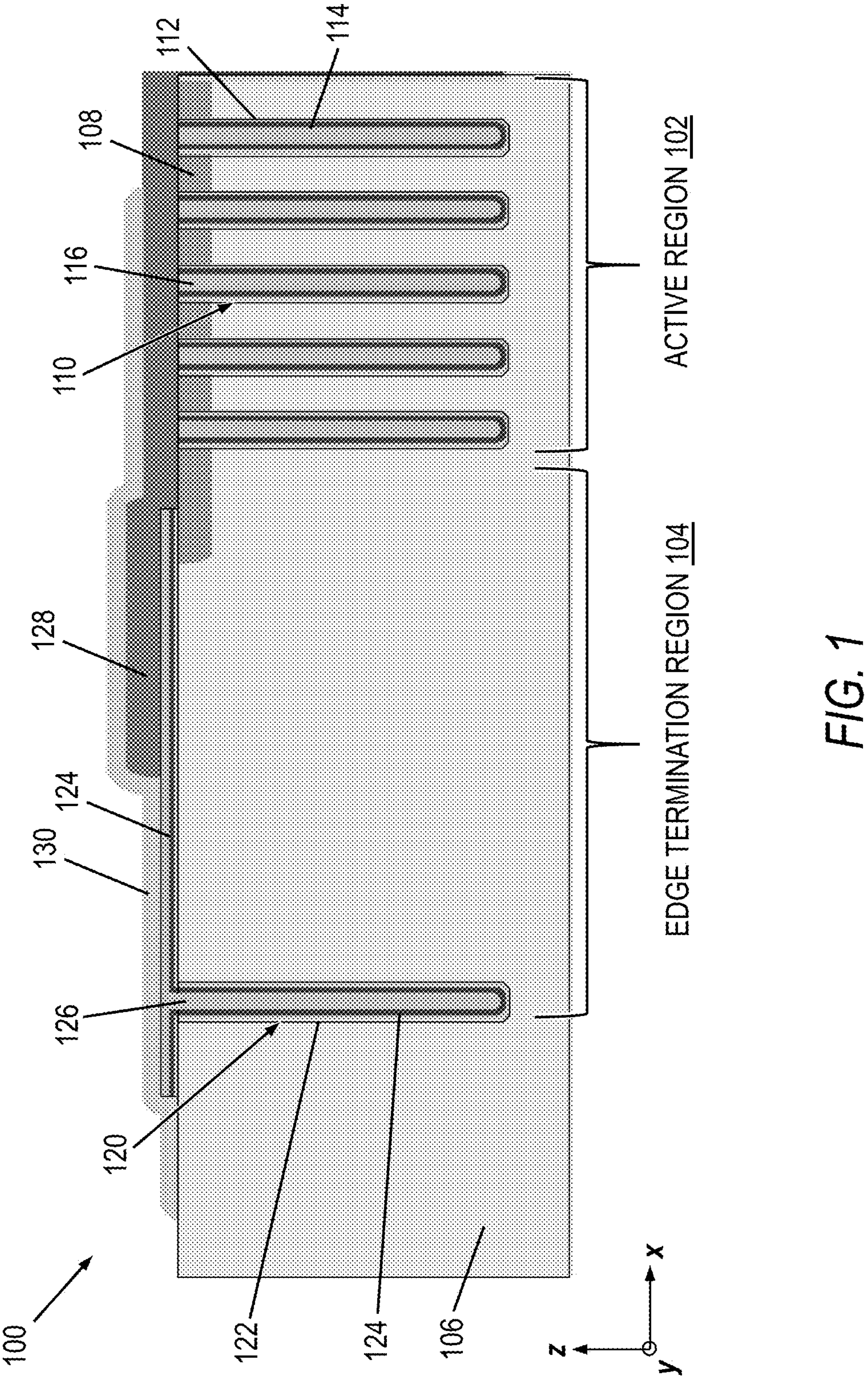
FIG. 1 is a cross-sectional view depicting at least a portion of an exemplary semiconductor die, according to one or more embodiments of the present invention.

It is to be appreciated that elements in the figures are illustrated for simplicity and clarity. Common but well-understood elements that may be useful or necessary in a commercially feasible embodiment are not necessarily shown in order to facilitate a less hindered view of the illustrated embodiments.

DETAILED DESCRIPTION

Principles of the present invention, as manifested in one or more embodiments thereof, will be described herein in the context of illustrative edge termination structures in a semiconductor device configured to withstand a blocking voltage in both lateral and vertical directions, and methods for fabricating such structures. The novel edge termination structures according to embodiments of the invention are suitable for use in a charge balanced semiconductor device, and may have beneficial application, for example, in a power device or power system environment for providing direct current (DC)-DC or alternating current (AC)-DC conversion. It is to be appreciated, however, that the present inventive concepts are not limited to the specific structures and/or methods illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

Reference may be made herein to “exemplary” embodiments, devices, circuits, methods, etc. As used herein, the term “exemplary” is intended to mean “serving as an example, illustration, instance or explanation,” and is not intended to imply that an embodiment, device, circuit, method, etc., serves as a model to be accurately copied. In other words, any embodiment, device, circuit, method, etc., described herein as being “exemplary” should not necessarily be interpreted as being preferable or advantageous over other embodiments, devices, circuits, methods, etc., within the scope of the present disclosure.

As previously stated, vertically conducting semiconductor devices in an IC may include an active region that is surrounded by an edge termination region. In such vertical devices, the edge of the die is invariably at the same or similar voltage potential as that of a bottom of the device due primarily to the lack of a blocking junction at the edge of the device. Consequently, an edge termination region is an important part of the device design to ensure lateral blocking of potentially damaging voltages between the active region and the edge of the die. While the active region only needs to withstand the blocking voltage in the vertical direction, the edge termination region should be configured to withstand the blocking voltage in both lateral and vertical directions.

In conventional planar edge termination schemes for vertical devices, an important objective is to ensure a gradual change in the equipotential lines (associated with the electric field) along a length of the edge termination region which can increase breakdown voltage in the device. Although several mechanisms have been employed in an attempt to achieve this objective, such as, for example, the using various doping arrangements at the surface of the device (e.g., JTE), passivation films (e.g., SIPOS) on the surface of the device, and metal field plates, these planar edge termination schemes typically involve the formation of additional surface layers on existing structures and/or layers required to fabricate an active device. These additional surface layers can increase IC processing costs and complexity, and potentially reduce reliability and/or device yield, which is undesirable.

The requirement of an edge termination region to maintain a voltage blocking capability in both the vertical and lateral directions makes the design of the edge termination region particularly challenging. Accordingly, the design of the edge termination region in the device may become a critical factor in determining the performance and cost of the device.

An edge termination region according to one or more embodiments of the inventive concept provides several advantages over conventional edge termination schemes for vertical devices, including, but not limited to: providing a compact edge termination region that minimizes additional semiconductor area consumption; minimizing additional process steps, thereby reducing overall cost and fabrication complexity and improving yield; withstanding a blocking voltage in both the lateral and vertical direction so as to achieve a breakdown voltage consistent with or greater than that of the active region. Moreover, embodiments of the invention can provide an edge termination that is compatible with other edge termination features that may be employed to improve an effectiveness of the edge termination structures, including, for example, inner field plates, outer field plates, JTEs, variable lateral diffusion (VLD), and use of a charged or resistive layer on a surface of the device.

For charge balance devices as well as standard power device employing planar edge termination structures, there is a need to charge balance the edge termination region while concurrently passivating the surface of the edge termination region to ensure that optimal breakdown voltages are achieved in the device. In some embodiments, effective surface passivation could be quantified in silicon by having a low interface trap density (e.g., Dit<about $1\times10^{11}$ $cm^{-2}$ $eV^{-1}$). It has been discovered, in accordance with aspects of the inventive concept, that a structure and processing method for achieving an edge termination region in the device can be beneficially achieved by utilizing the same charged film that is used to create a charge balance region in the active area of the device.

FIG. 1 is a cross-sectional view depicting at least a portion of an exemplary IC die 100, according to one or more embodiments of the present inventive concept. The IC die 100, which may comprise one or more vertically conducting devices, may include an active region 102 that is surrounded by an edge termination region 104. The term "surrounding" (or similar uses of the term, such as "surround" or "surrounded") as used herein is intended to refer broadly to a layer or structure that envelops, encircles, or encloses another layer or structure on all sides, although breaks or gaps may also be present. Thus, for example, a material layer having breaks or gaps therein may still be considered to "surround" another layer which it encircles.

In one or more embodiments, the active region 102 and the edge termination region 104 may comprise an n-type epitaxial layer 106, although embodiments of the invention are not limited to this specific arrangement. For example, in some embodiments, a p-type epitaxial layer 106 may be employed. As will be known by those skilled in the art, n-type material used to form the epitaxial layer 106, which may be referred to herein as a drift region, can be formed by doping semiconductor material (e.g., silicon) with an n-type (donor) dopant element, such as, for example, phosphorous, arsenic, etc., at a prescribed doping concentration. Likewise, the p-type material layer can be formed by doping the semiconductor material with a p-type (acceptor) dopant element, such as, for example, boron, at a prescribed doping concentration.

In vertically conducting devices, an edge of the IC die 100 is invariably at the same or similar voltage potential as that of a bottom surface of the device, due primarily to the lack of a blocking junction at the edge of the device. Therefore, there is a need to not only block voltages between the top and bottom surfaces of the vertical device, but also to block voltages laterally between the active region 102 of the device and edge of the IC die 100; the edge termination region 104 is the region in the device that provides this lateral voltage blocking capability.

A doped layer 108, which may be a p-type conductivity type region in some embodiments, may be formed in the epitaxial layer 106 in the active region 102, proximate an upper surface of the epitaxial layer. The doped layer 108 may extend laterally (e.g., in the x direction) partially into the edge termination region 104. The active region 102 may include a plurality of active trench structures 110. The term "active trench structures" as used herein is intended to refer to trench structures that are formed in the active region 102 of the IC device 100, and does not necessarily refer to trench structures that are active in the same meaning as an active device, such as, for example, a transistor or diode.

Each of the active trench structures 110 may extend through the doped layer 108 and at least partially through the epitaxial layer 106 in a substantially vertical direction (z direction). In one or more embodiments, the active trench structures 110 extend at least twenty-five percent (25%) through the epitaxial layer 106; in some embodiments, the active trench structures 110 may extend entirely through the epitaxial layer 106 and into an underlying substrate (not explicitly shown, but implied) on which the epitaxial layer is disposed.

Each of the plurality of active trench structures 110 may be optionally lined with an insulating layer 112, such as, but not limited to, silicon dioxide ($SiO_2$), silicon oxynitride ($SiO_xN_y$), silicon nitride (SiN), etc. A charged layer 114 may be formed on an outer (exposed) surface of the insulating layer 112 in the active trench structures 110.

The charged layer 114, which may comprise, for example, alumina ($Al_2O_3$) or another material having an inherent surface charge of a prescribed polarity type (e.g., negative or positive), may be formed as a deposited film using atomic layer deposition (ALD) or a similar process (e.g., chemical vapor deposition (CVD)). The charged layer 114 may, in some embodiments, be formed as a stacked film comprising a plurality of material layers, not all of which (but at least one of which) may have an inherent surface charge associated therewith. When the charged layer 114 comprises an oxide or other insulating material, the insulating layer 112 may not be required.

The charged layer 114 in the active trench structures 110, having a net static charge of a first charge type (e.g., negative), will attract free charge carriers in the epitaxial layer 106 of a second charge type opposite the first charge type (e.g., positive). In the case of alumina, the charged layer 114 will have an inherent negative surface charge; it is to be appreciated, however, that embodiments of the invention are not limited to any specific material(s) for forming the charged layer 114. The free charge carriers in the epitaxial layer 106 will be attracted to the charged layer 114 disposed on sidewalls and a bottom of the active trench structures 110 and will migrate towards the charged layer 114, thereby forming the equivalent of an inversion layer surrounding the active trench structures 110, thereby creating a charge balance region in the active region 102 of the IC 100. In a reverse voltage mode of operation, an entirety of a mesa between adjacent trench structures 110 effectively becomes a charge balance region where the charge in the charged layer 114 balances the charge of the ionized (or depleted) donors in the n-type epitaxial layer 106. It is this depleted charge balance region that may be important for voltage blocking in an off-state of the device.

It is to be understood that when describing a layer or region as having a particular polarity type, we are referring to the presence of charged free carriers of a particular polarity type in the material. Thus, for example, an n-type material will have an inherent fixed negative polarity due to the presence of negatively charged free carriers.

In some embodiments, each of at least a subset of the active trench structures 110 may comprise a fill material 116 disposed on an outer (exposed) surface of the charged layer 114 in the active trench structures 110. As may be used herein, the term "fill" (or similar terms "filling" or "filled"), as used herein, is intended to broadly refer to either completely filling a defined space (e.g., active trench structures 110) or partially filling the defined space; that is, the defined space need not be entirely filled but may, for example, be partially filled or have voids or other spaces throughout. The fill material 116, which may be an insulating or a non-insulating material (e.g., silicon dioxide, polysilicon, metal, etc.), may provide structural support for the active trench structures 110, but otherwise the electrical properties (e.g., conductivity, resistivity, etc.) of the material 116 filling the active region trench structures 110 may not necessarily be relevant to an operation of the device. In some embodiments, however, certain properties of the fill material 116 used to fill the trench structures 110, such as, for example, dielectric constant, can play a role in device operation.

The edge termination region 104 may include one or more outer trench structures 120. The outer trench structure(s) 120 may be formed at least partially through the epitaxial layer 106 in a substantially vertical direction (z direction) and may extend along a y direction, perpendicular to the z direction. The edge termination region 104 may be defined so as to include the epitaxial layer 106, and any structures or devices formed therein, between a last one of the active trench structures 110 and a first (or only) of the outer trench structures 120. In one or more embodiments, the same trench processing (e.g., photolithographic patterning, etching and/or trench filling, etc.) is preferably used to form both the active trench structures 110 and the outer trench structure (s) 120; that is, the same mask and trench etch and fill processes are used to form both the active trench structures 110 in the active region 102 and the outer trench structures 120 in the edge termination region 104.

More particularly, the outer trench structure(s) 120, like the active trench structures 110, may be lined with an insulating layer 122, such as, but not limited to, silicon dioxide ($SiO_2$), disposed on sidewalls and a bottom of the outer trench structure. The insulating layer 122 may also extend beyond the outer trench structure(s) 120 and onto at least a portion of the upper surface of the epitaxial layer 106 in the edge termination region 104.

A charged layer 124 may be formed on an outer (exposed) surface of the insulating layer 122 in the outer trench structure(s) 120. The charged layer 124 may comprise, for example, alumina ($Al_2O_3$) or another material having an inherent surface charge of a prescribed polarity type (negative or positive). The charged layer 124 in the outer trench structure(s) 120, which may be formed as a deposited film using ALD or a similar deposition process used to form the charged layer 114 in the active trench structures 110, preferably has a net static charge of the first charge type (e.g., negative) that will attract free charge carriers of the second charge type, opposite the first charge type (e.g., positive), in the epitaxial layer 106. In the case of alumina, the charged layer 124 will have an inherent negative surface charge. The free charge carriers in the epitaxial layer 106 in the edge termination region 104 will be attracted to the charged layer 124 disposed on sidewalls and a bottom of the outer trench structure(s) 120 and will migrate towards the charged layer 124, thereby forming the equivalent of an inversion layer surrounding the outer trench structure(s) 120; this inversion layer creates a charge balance region in the edge termination region 104 of the IC 100.

Note, that since the trench structures 120, in some embodiments, may extend into the substrate (not explicitly shown), which is heavily doped, an inversion layer may not necessarily be formed (i.e., the charge in the charged layer 124 may be too low relative to the substrate doping). This can actually be advantageous, since having an inversion layer going all the way around the last trench may increase leakage in the device. But as previously mentioned, the fact that the charge associated with the charged layer 124 attracts free carriers of the opposite charge in an on-state of the device is, in some respects, immaterial to the voltage blocking functionality of the device in its off-state. The function of the charge in the charged layer 124 is primarily to repel charge carriers of the same charge type (i.e., polarity) when the device is in a reverse voltage state (i.e., off-state), so as to ensure that the mesa is fully depleted of free charge carriers.

In some embodiments, the charged layer 124 may extend laterally (e.g., in the x direction) beyond the outer trench structure(s) 120 and onto at least a portion of an upper surface of the insulating layer 122 in the edge termination region 104. This extension of the charged layer 124 will form a charge balance region proximate the upper surface of the epitaxial layer 106 in a manner consistent with the formation of the charge balance region surrounding the outer trench structure(s) 120. The presence of the charged layer 124 across all or part of the edge termination region 104 may beneficially increase the breakdown voltage of the IC device 100 by spreading out (i.e., distributing) the electric field in the edge termination region 104. It may be difficult to define a "charge balance region" in a voltage blocking scenario, since a separate charge balance region may not actually be formed (unless it is defined in the on-state by creation of an accumulation region). Assuming that the edge termination region is already charge balanced by the presence of trenches, the ALD layer on the surface modifies the charge balance at the surface of the edge termination region, which helps the electric field to spread out and thereby increase breakdown voltage in the device, among other benefits.

With continued reference to FIG. 1, in some embodiments, the outer trench structure(s) 120 may be at least partially filled with a fill material 126 disposed on an outer (exposed) surface of the charged layer 124. A standard trench fill process, such as, for example, ALD or another deposition scheme, may be used to fill the outer trench structure(s) 120 with the fill material 126. The fill material 126, which may be an insulating or a non-insulating material (e.g., silicon dioxide, polysilicon, metal, etc.), may provide structural support (or even thermal dissipation, among other benefits) for the outer trench structure(s) 120, but otherwise the electrical properties (e.g., conductivity, resistivity, etc.) of the material 126 filling the outer region trench structure(s) 120 may not necessarily impact an operation of the IC device 100.

The fill material 126, in some embodiments, may extend laterally beyond the outer trench structure(s) 120 and may be disposed on at least a portion of an upper surface of the charged layer 124 in the edge termination region 104. A first conductive layer 128, which may comprise a metal, may be formed over an upper surface of the active trench structures 110 and over an upper surface of the doped layer 108 in the active region 102. In one or more embodiments, the first conductive layer 128 may extend laterally (e.g., in the x direction) into the edge terminal region 104, over at least a portion of an upper surface of the fill material 126. Configured in this manner, the extension of the first conductive layer 128 may serve as a field plate.

The first conductive layer 128 may be electrically connected to at least a subset of the active trench structures 110 and/or to a voltage source (e.g., ground) and is configured to control an electric field distribution in the edge termination region 104. Specifically, the first conductive layer 128, serving as a field plate, may be configured as an electrode disposed over at least a portion of the epitaxial layer 106 in the edge termination region 104 to distribute the electric field away from the active region 102 and to mitigate a peaking of the electric field in the edge termination region 104 as well as in the active region 102 proximate the edge termination region 104. In general, field plates can beneficially help reduce the maximum electric field, achieve a prescribed electrical field profile across a defined region, and increase a breakdown voltage of the IC device. The amount of lateral extension of the first conductive layer 128 over the epitaxial layer 106, in the x-direction, may be adjusted to control a profile of the electric field distribution in the edge termination region 104 and in the region of active area adjacent to the edge termination region 106.

In one or more embodiments, a passivation layer 130 may be formed over at least a portion of the IC device 100, including over at least a portion of an upper surface of the first conductive layer 128, an upper surface of the outer trench fill material 126, and at least a portion of the upper surface of the epitaxial layer 106 outside of the edge termination region 104.

In accordance with aspects of the present inventive disclosure, the same layers and/or process steps used to form the active trench structures 110 in the active region 102 can be used to create the outer trench structure(s) 120 in the edge termination region 104, as previously stated. In this manner, an edge termination region 104 is provided in the IC device 100 that is capable of not merely withstanding the blocking voltage in both the lateral and vertical directions, but additionally provides a charge balanced edge termination region 104 in a manner consistent with the charge balanced active region 102 provided by the active trench structures 110. Furthermore, in one or more embodiments, since the trench structure(s) 120 in the edge termination region 104 is(are) formed using the same materials and fabrication steps used to form the active trench structures 110, the necessity of additional process steps can be eliminated, thereby reducing fabrication costs compared to conventional approaches, such as, for example, a JTE-type scheme.

Although the illustrative semiconductor device 100 shown in FIG. 1 may include a plurality of active trench structures 110 and at least one outer trench structure 120, it is to be understood that such trench structures are not necessarily required for forming a semiconductor device having improved breakdown voltage characteristics. Specifically, in one or more embodiments, the semiconductor device may include the epitaxial layer 106 and the charged layer 124 formed on the upper surface of the epitaxial layer 106, the charged layer 124 covering at least a portion of the active region 102 and extending laterally over at least a portion of the edge termination region 104; that is, the active trench structures 110 and the outer trench structure 120 may be omitted in some embodiments.

In the illustrative embodiment shown in FIG. 1, the −ye charge (i.e., the fixed/inherent charge) of the charged layers 114, 124 (e.g., alumina) may behave in a similar manner to structures that have a p-type implant in the edge termination region 104 (e.g., those using a JTE-type scheme). That is, for JTE the net charge at the surface can be modified by doping with p-type material (which leaves −ve charged ionized acceptors when in the voltage blocking state). Since there is −ve charge in the charged layers 114, 124 (e.g., alumina), the structure behaves in a similar manner; that is, both introduce −ve charge into the device when blocking. Note, that in the on-state, the JTE is p-type so there are +ve free carriers, just like how in the on-state the alumina will also attract a region of +ve free carriers to the surface.

A JTE edge termination scheme may involve creating a low doped region (i.e., a doped region of low dopant/impurity concentration) of opposite polarity to a drift resistance in the device (e.g., a p-type doped region in an n-type drift region). The total charge in this JTE region, $Q_{JTE}$, will be related to an expected critical electrical field, $E_C$, at which avalanche breakdown will occur, such that:

$$Q_{JTE} \approx \frac{\varepsilon_R \varepsilon_0}{q} \cdot E_C,$$

where $\varepsilon_0$ represents permittivity in a vacuum (about $8.85\times10^{14}$ farads/centimeter (F/cm)), $\varepsilon_R$ represents relative permittivity of silicon (about 11.7), and q represents elementary charge (about $1.6\times10^{19}$ coulombs (C)).

In accordance with aspects of the present inventive concept, it has been discovered that for a charge balanced device, the optimal charge for the charged layer follows the same equation as for the charge needed for a JTE termination in the device; that is, the charge needed at the surface of a JTE termination is essentially the same as that needed to charge balance the device. Embodiments of the present invention advantageously exploit this observation to fabricate a novel device comprising a charged layer that is configured to charge balance the active region of the device and to form, in at least part of the edge termination region in the device, a charged layer that is configured to improve the breakdown voltage of the edge termination.

Figure 2A:
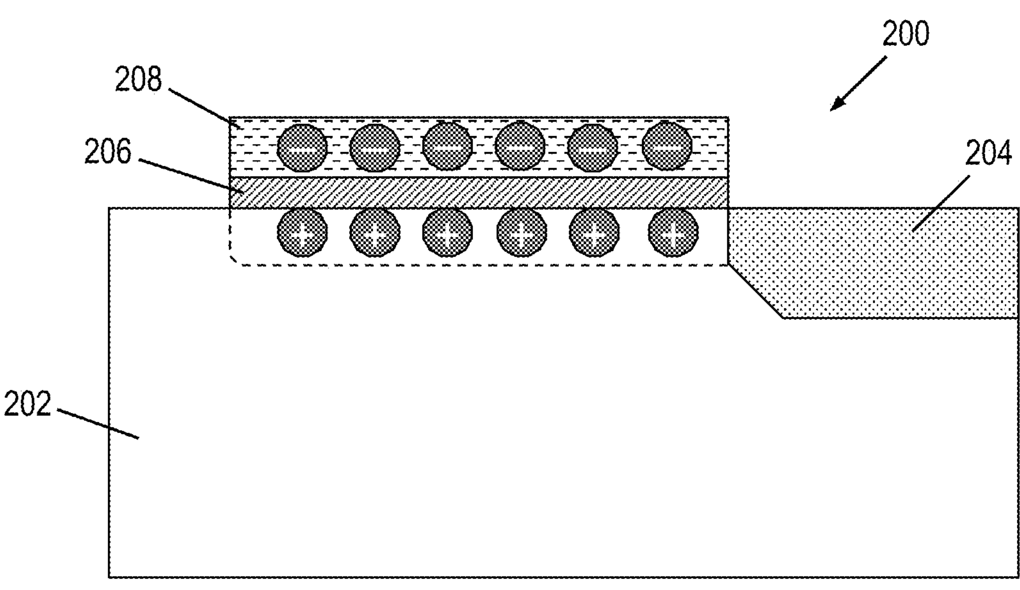
FIG. 2A is a cross-sectional view depicting at least a portion of an exemplary charged layer formed in a semiconductor device.

FIG. 2A is a cross-sectional view depicting at least a portion of an exemplary charged layer formed in a semiconductor device 200. The semiconductor device 200 may include an epitaxial layer 202 in which a p-type material layer 204 may be formed proximate an upper surface of the epitaxial layer 202 (depending on the type of device being formed). The epitaxial layer 202 may be doped with impurity material of a first conductivity (i.e., polarity) type (e.g., n-type) at a prescribed concentration level. N-type material used to form the epitaxial layer 202, which may be referred to herein as a drift region, can be formed by doping semiconductor material (e.g., silicon) with an n-type (donor) dopant element, such as, for example, phosphorous, arsenic, etc., at a prescribed doping concentration; embodiments of the invention are limited to any specific dopant or material for forming the epitaxial layer 202.

The semiconductor device 200 may further include an insulating layer 206 disposed on at least a portion of the upper surface of the epitaxial layer 202. The insulating layer 206 may comprise an oxide (e.g., silicon dioxide) or another insulating material. A charged layer 208 may be disposed on at least a portion of an upper surface of the insulating layer 206. The charged layer 208 is configured having an inherent surface charge of a given polarity type (negative or positive). For example, in some embodiments, alumina ($Al_2O_3$), which has an inherent negative fixed charge associated therewith, may be employed as the charged layer 208.

Figure 2B:
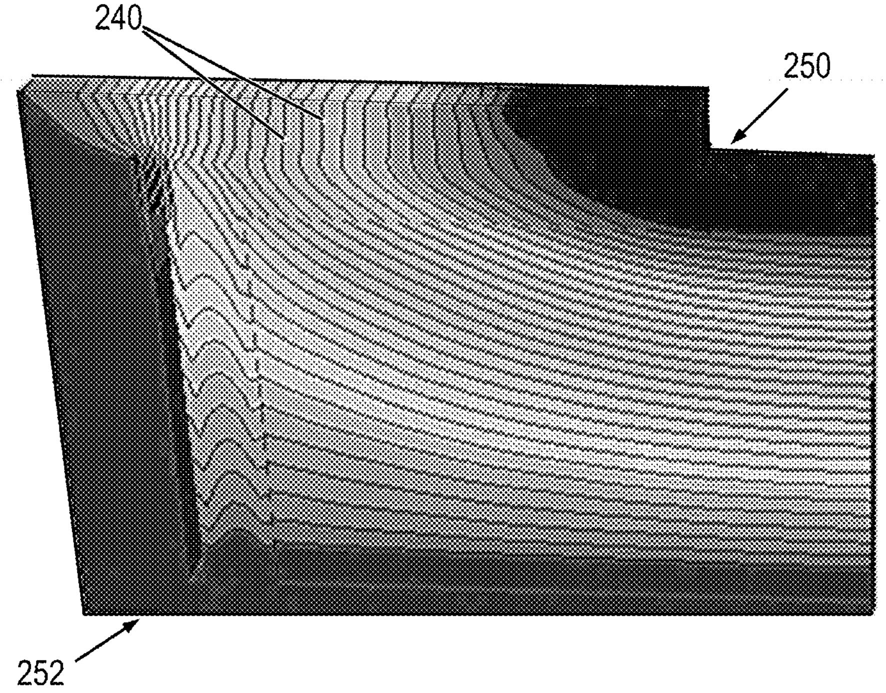
FIG. 2B conceptually depicts simulated electric field potential lines in an edge termination region corresponding to an exemplary semiconductor device having a charged layer on the surface of the device, as shown in FIG. 2A.

FIG. 2B conceptually depicts a simulated edge termination region which may correspond to the exemplary semiconductor device 200 having a charged layer 208 on the surface of the device, as shown in FIG. 2A. With reference to FIG. 2B, it is evident how the equipotential lines 240 spread out across the edge termination region between a zero-volt terminal (i.e., ground) 250 and a high-voltage terminal 252.

In JTE termination structures, there may be schemes where the charge varies laterally along the edge termination region. Embodiments of the inventive concept will describe how similar schemes can be achieved.

Edge termination structures may include films or other materials required for device reliability, such as, for example, silicon nitride (SiN), borophosphosilicate tetraethylorthosilicate (BPTEOS), phosphorous-doped TEOS, etc. These films may include fixed charges associated therewith, as may the material used to encapsulate the IC device. In addition, contamination by materials that may enter the device (or other factors) over a lifetime of the device may have charge (typically +ve) associated therewith that can affect an operation and/or reliability of the edge termination structure. An impact of this may be that the optimal charge in the active region may be different than the charge in the edge termination region, which may need to compensate for these additional "charges." Therefore, embodiments of the inventive concept may be included that will allow the edge termination region charge to be different relative to the active region charge.

Figure 3:
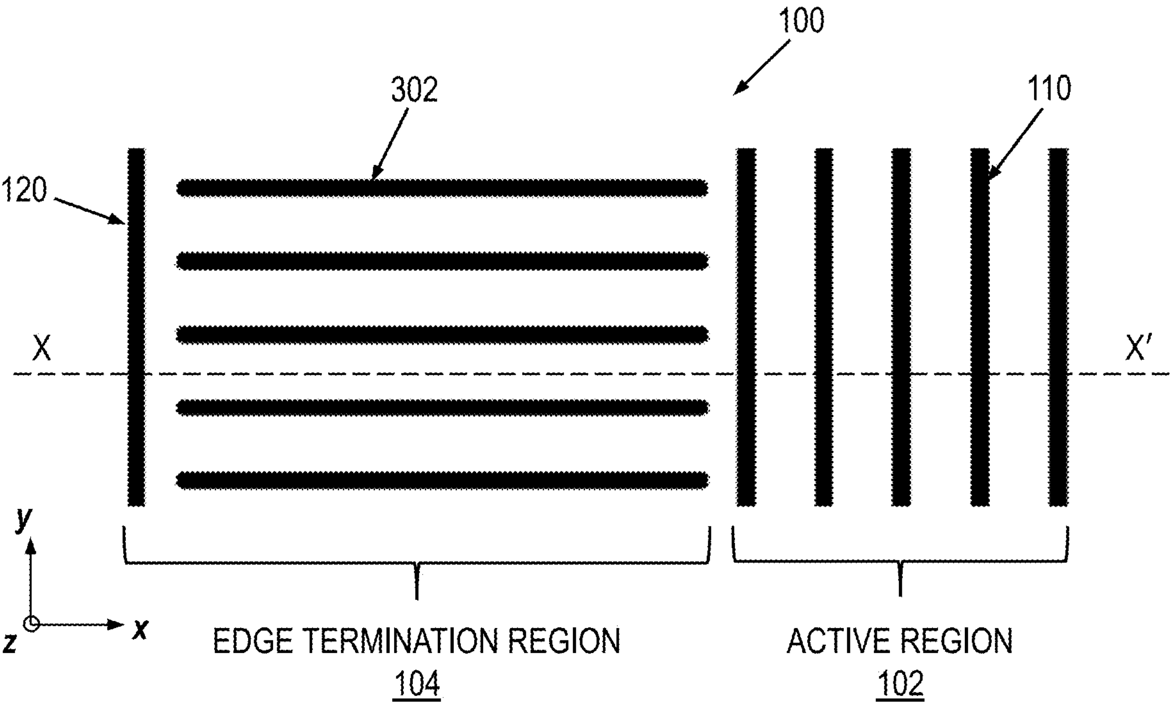
FIG. 3 is a top plan view of the exemplary semiconductor device depicted in FIG. 1, according to one or more embodiments of the invention, with the semiconductor device shown in FIG. 1 representing a cross-section of the device shown in FIG. 3 taken along line X-X'.

FIG. 3 is a top plan view of the exemplary IC device 100 depicted in FIG. 1, according to one or more embodiments of the invention; the IC device 100 shown in FIG. 1 represents a cross-section of the device 100 shown in FIG. 3 taken along line X-X'. With reference to FIGS. 1 and 3, the cross-sectional view shows trenches 110 in the active region 102, which may be an array of stripes that can be periodically broken. It is to be appreciated, however, that the active trenches 110 may be formed of any shape or configuration (e.g., an array of islands, or hexagonal in shape).

As apparent from FIG. 3, the edge termination region 104 may also include a plurality of edge trench structures 302 which may be configured as parallel stripes running in the x direction, perpendicular to the active trench structures, but can alternatively (or in addition to) be configured in any shape, number or arrangement, including, for example, parallel and/or orthogonal stripes, or an extension of the active trench structures 110 into the edge termination region 102. (See, e.g., U.S. provisional application No. 63/420,339, the disclosure of which is incorporated by reference herein in its entirety, which describes various configurations of the edge trench structures in the edge termination region.) It is also contemplated that, in some embodiments, there may be no edge trench structures 302 in the edge termination region 104.

In FIG. 1, only an outer trench structure 120 is shown and not the edge termination structures (302 in FIG. 3). This is because the cross-sectional view of FIG. 1 is taken along line X-X', which is located in a mesa area of the epitaxial layer 106, between adjacent edge trench structures 302 running in the x direction in the edge termination region 104. Furthermore, although an outer trench structure 120 is shown in FIGS. 1 and 3, disposed at an end of the edge termination region 104, opposite the active region 102, and orthogonal to the edge trench structures 302, it is to be understood that an outer trench structure 120 is not required and may be omitted in some embodiments.

An edge termination scheme according to one or more embodiments of the invention can be used for different types of active region devices. In integrating an edge termination region (e.g., 104 in FIG. 1) according to aspects of the present disclosure with an active region (e.g., 102 in FIG. 1) in an IC device, one or more intermediate fabrication processes used in forming devices in the active region may be interspersed between steps performed during formation of the edge termination region. For example, implants that may require a high thermal budget (e.g., greater than about 1000 degrees Celsius (° C.)) may be performed at a start of the fabrication process, a gate trench may be formed either before or after a deep trench etch and fill process used to create active and edge trench structures, and shallow implants requiring minimal thermal budgets (e.g., less than about 950° C.) may be performed following the trench fill process. Furthermore, certain process steps used in fabricating the active region may be concurrently performed in forming at least a portion of the edge termination region; that is, one or more process steps performed in fabricating at least one of the structures in both the active region and the edge termination region may be shared, according to embodiments of the invention.

It is to be appreciated that the example temperature ranges given above for "high" and "low" thermal budget processes are merely rough estimates, since the concept of a "thermal budget" is generally characterized as a combination of temperature and time. Thus, for example, a low thermal budget could be 1100° C. with rapid thermal processing (RTP). Generally, if it is desirable for an implant to diffuse deeply into a given material, the implant step is typically done at an early stage in the processing to take into account all the thermal processing performed in fabricating the device. Conversely, if it is not desirable for an implant to diffuse significantly, the implant step may be done towards the end of the fabrication process to minimize the amount of thermal processing to which the implant may be subjected.

Figure 4:
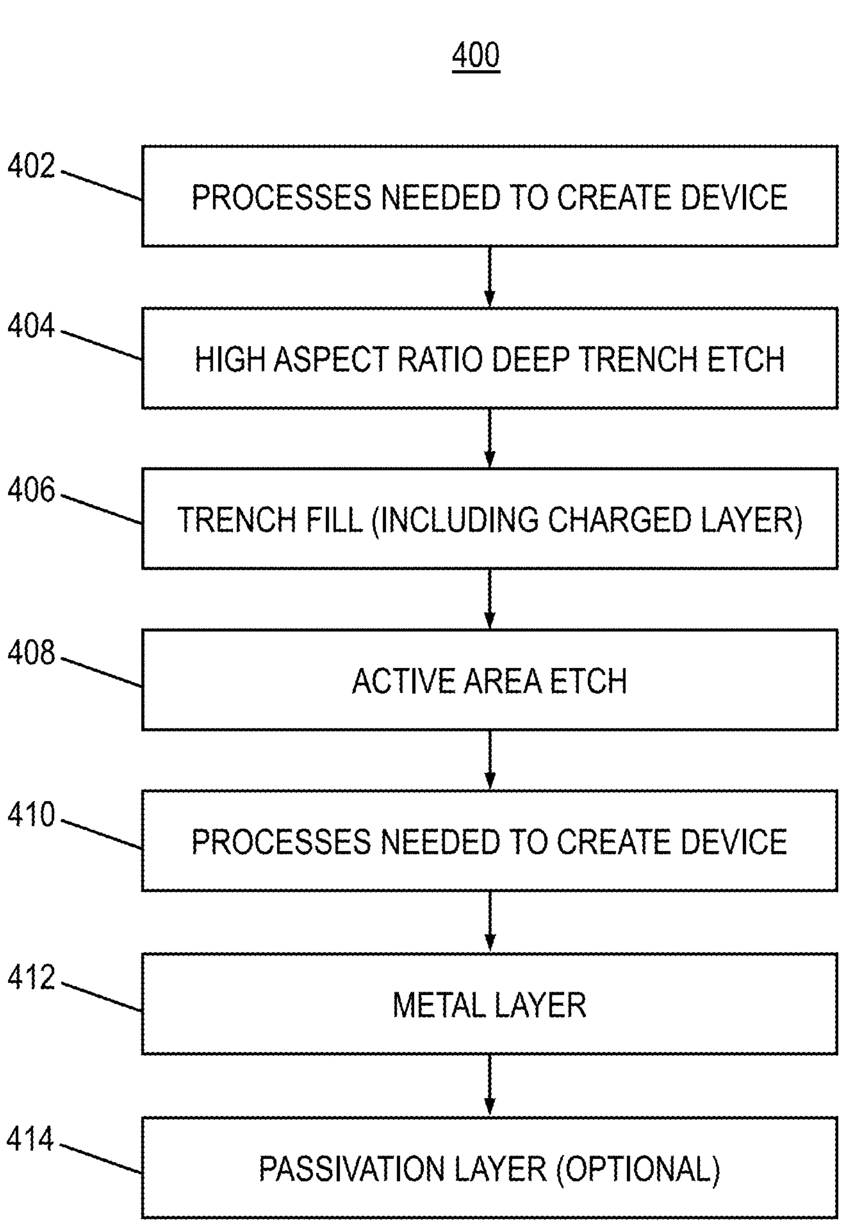
FIG. 4 is a flow diagram depicting at least a portion of an exemplary method for fabricating a semiconductor device, according to one or more embodiments of the present invention.

By way of example only and without limitation, FIG. 4 is a flow diagram depicting at least a portion of an exemplary method 400 for fabricating a semiconductor device, according to some embodiments. With reference to FIG. 4, the method 400 initially performs certain processes in step 402 used to fabricate the semiconductor device, including implants that may require a high thermal budget. In step 404, a high aspect ratio deep trench etch may be performed for creating one or more active trenches (e.g., for forming active trench structures 110 in FIG. 3) in an active region of the device, and for creating one or more edge trenches (e.g., for forming edge trench structures 302 in FIG. 3) and one or more outer trenches (e.g., for optionally forming outer trench structure 120, if used) in an edge termination region of the device. In one or more embodiments, deep reactive-ion etching (DRIE) may be used to perform the deep trench etch, although the inventive concept is not limited thereto.

In step 406, one or processes used to fill the trenches may be performed. In some embodiments, the trench fill process may include forming an insulating layer (e.g., insulating layer 112, 122 in FIG. 1) on at least a portion of sidewalls and a bottom of each of the trenches. An ALD or other deposition process may be used to form the insulating layer in the trenches. A charged layer (e.g., charged layer 114, 124 in FIG. 1) may be disposed on an outer (exposed) surface of the insulating layer in each of the trenches in both the active region and the edge termination region of the semiconductor device. An ALD or other deposition process may be used to form the charged layer in the trenches. In some embodiments, the charged layer may comprise alumina, although embodiments of the inventive concept are not limited thereto. Each of at least a subset of the trenches is then at least partially filled with a fill material (e.g., 116, 126 in FIG. 1). As previously stated, the same fill process used to form the active trench structures in the active region is used to form the edge trench structures (and outer trench structure, if present) in the edge termination region (including the charged layer), according to one or more embodiments.

An etch may be performed in step 408 to open a defined portion of the active region. The active region etch is an etch through the layers used to fill the trenches to allow access to the active region in the semiconductor device. The active region etch may be performed using a wide area etch or may be performed through an array of contact openings formed in the device. In the case of fabricating a diode, for example, this active region etch in step 408 may comprise a contact etch.

In step 410, additional processes used to fabricate the semiconductor device may be performed. Such additional processes may include, for example, a gate trench formation process, shallow implant process (e.g., for forming drain and source regions and/or p-n junctions in the device), etc. As previously stated, processes used to form the active and edge trench structures in the semiconductor device may be interspersed between other processes used to create the final semiconductor device.

A metal or other conductive layer may be formed in step 412 to provide electrical connection to the semiconductor device and/or to connect one or more circuit elements and structures in the device. Optionally, in step 414, a passivation layer may be formed over at least a portion of the semiconductor device, including over at least a portion of an upper surface of the conductive layer, an upper surface of the edge and outer trench structures in the edge termination region, and at least a portion of an upper surface of the active trench structures in the active region. In one or more embodiments, the passivation layer may comprise a charged layer that is configured to charge balance the active region of the device and to form at least part of a surface passivation of the edge termination region in the device for providing charge balancing in the edge termination region as well.

FIGS. 5A to 5E are cross-sectional views respectively illustrating a sequence of intermediate processes of an exemplary method of manufacturing an integrated circuit device, according to one or more embodiments. Although the exemplary method may be used in the context of fabricating an illustrative PN diode, it is to be appreciated that other devices and/or structures may be similarly formed using the techniques of the method described herein, as will become apparent to those skilled in the art.

Figure 5A:
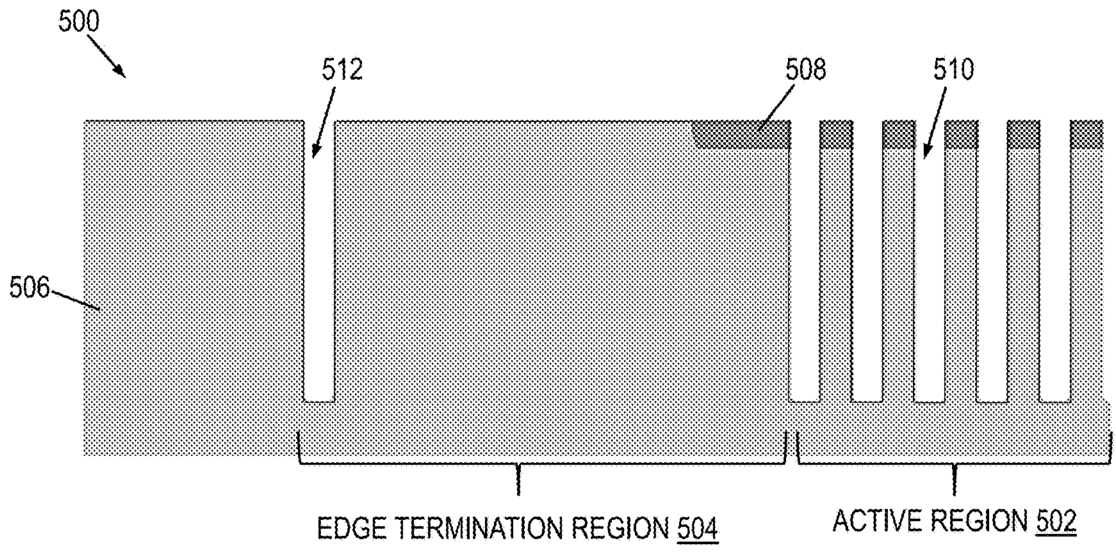
FIGS. 5A through 5E are cross-sectional views respectively illustrating a sequence of intermediate processes of an exemplary method of manufacturing a semiconductor device, according to one or more embodiments of the present invention.
Figure 5B:
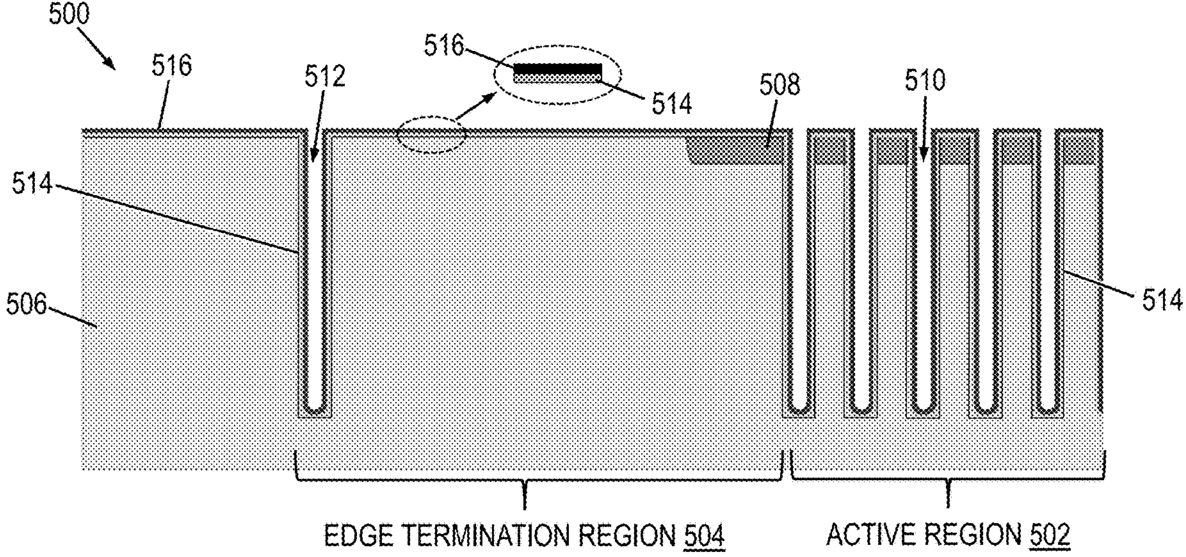

In FIG. 5A, a deep trench formation process is illustrated, wherein a plurality of trenches are formed in active and edge termination regions of the device. With reference to FIG. 5A, at least a portion of a semiconductor device 500 is shown in which active device processing has already been completed. It is to be appreciated that at least a portion of the active device processing may also be performed subsequent to the deep trench formation process. More particularly, in the illustrative case of fabricating a PN diode, the device 500 may include an active region 502 and an edge termination region 504 laterally adjacent to the active region (in an x direction). In one or more embodiments, an n-type epitaxial layer 506, which may be disposed on a semiconductor substrate (not explicitly shown, but implied), maybe formed in the active region 502 and the edge termination region 504. As will be known by those skilled in the art, n-type material used to form the epitaxial layer 506, which may be referred to herein as a drift region, can be formed by doping semiconductor material (e.g., silicon) with an n-type (donor) dopant element, such as, for example, phosphorous, arsenic, etc., at a prescribed doping concentration using an implant process or similar. It is to be appreciated that a p-type epitaxial layer 506 may alternatively be formed by doping the semiconductor material with a p-type (acceptor) dopant element, such as, for example, boron, at a prescribed doping concentration.

On or more doped layers (not explicitly shown) may be formed proximate an upper surface of the epitaxial layer 506 in the active region 502 for forming active device therein (depending on the type of device being formed). In one or more embodiments, a doped layer 508, which may be an area or well of p-type conductivity type in some embodiments, may be formed in the epitaxial layer 506 in the active region 502, proximate an upper surface of the epitaxial layer. The doped layer 508 may extend laterally (i.e., in the x direction) partially into the edge termination region 504.

The active region 502 may include a first plurality of trenches 510 formed therein. Each of the first plurality of trenches 510, which may be used to form active trench structures in the device 500, preferably extends through the doped layer 508 and at least partially through the epitaxial layer 506 in a substantially vertical direction (i.e., z direction). The first plurality of trenches 510 may be formed using a DRIE process, or other etching process, configured to create deep trenches having a high aspect ratio (e.g., greater than about 10:1 for most higher voltage applications, but lower aspect ratios, such as about 5:1, may also be used in the case of lower voltage applications). In one or more embodiments, the first plurality of trenches 510 may extend at least twenty-five percent (25%) through the epitaxial layer 506; in other embodiments, the first plurality of trenches 510 may extend entirely through the epitaxial layer 506 and into the underlying substrate (not explicitly shown, but implied) on which the epitaxial layer is disposed.

In a similar manner, the edge termination region 504 may include a second plurality of trenches (not explicitly shown in FIG. 5A, but shown as edge trench structures 302 in FIG. 3) formed therein. Each of the second plurality of trenches, which may be used to form edge trench structures in the device 500, preferably extends at least partially through the epitaxial layer 506 in a substantially vertical direction (i.e., z direction). In some embodiments, the second plurality of trenches may be arranged perpendicular to the first plurality of trenches 510, as shown in FIG. 3. One or more outer trenches 512 may be optionally formed in the edge termination region 504. In one or more embodiments, the outer trench(es) 512 and the second plurality of trenches (not explicitly shown) are formed in the edge termination region 504 concurrently during the formation of the first plurality of trenches 510 in the active region 502, and using the same etching process (e.g., DRIE or the like). It is also contemplated that one or more additional implants into the edge termination region 504 may be performed prior to the trench formation process.

After trench etching, there may be a sacrificial oxidation followed by deposition of a charged layer for achieving charge balancing in the device 500. With specific reference to FIG. 5B, each of the first plurality of trenches 510, the second plurality of trenches (not explicitly shown), and the outer trench(es) 512 may be optionally lined with an insulating layer 514, such as, but not limited to, silicon dioxide ($SiO_2$), silicon nitride (SiN), silicon oxynitride ($SiO_xN_y$), etc. In some embodiments, the insulating layer 514 may be formed by a thermal oxidation process, whereby a thin layer of oxide (e.g., $SiO_2$) is grown on exposed surfaces of the semiconductor device 500, including exposed sidewalls and a bottom of the trenches. In other embodiments, the insulating layer 514 may be deposited on the sidewalls and bottom surfaces of the trenches. The insulating layer 514 may be disposed on an upper surface of the epitaxial layer 506 outside of the trenches in the edge termination region 504 and on an upper surface of the doped layer 508 in the active region (i.e., over mesa areas between adjacent trenches 510).

A charged layer 516 may be formed over an upper surface of the semiconductor device 500, including at least on an exposed surface of the insulating layer 514 in the first plurality of trenches 510 in the active region 502, as well as on the insulating layer 514 in the second plurality of trenches and in the outer trench(es) 512 in the edge termination region 504. In one or more embodiments, the charged layer 516 may be formed on the insulating layer 514 outside of the trenches, such as over the epitaxial layer in the edge termination region 504 and the doped layer 508 in the active region 502 (i.e., over the mesa areas between adjacent trenches 510).

The charged layer 516 may comprise, for example, alumina ($Al_2O_3$) or another material having an inherent surface charge of a prescribed polarity type (e.g., negative or positive); in the case of alumina, an inherent negative surface charge is present without an applied bias. In one or more embodiments, the charged layer 516 may be formed as a deposited film using atomic layer deposition (ALD) or a similar process. The charged layer 516 may, in some embodiments, be formed as a stacked film comprising a plurality of material layers, not all of which (but at least one of which) may have an inherent surface charge associated therewith, such that the overall stacked film has an inherent surface charge associated therewith. In accordance with one or more embodiments, for a device 500 comprising an n-type epitaxial layer 506, a charged layer 516 having an inherent negative surface charge may be employed, and for a device 500 comprising a p-type epitaxial layer 506, a charged layer 516 having an inherent positive surface charge may be used. As previously stated, when the charged layer 516 comprises an oxide or other insulating material, the insulating layer 514 may not be required and is therefore optional, depending on the material used for the charged layer 516.

Figure 5C:
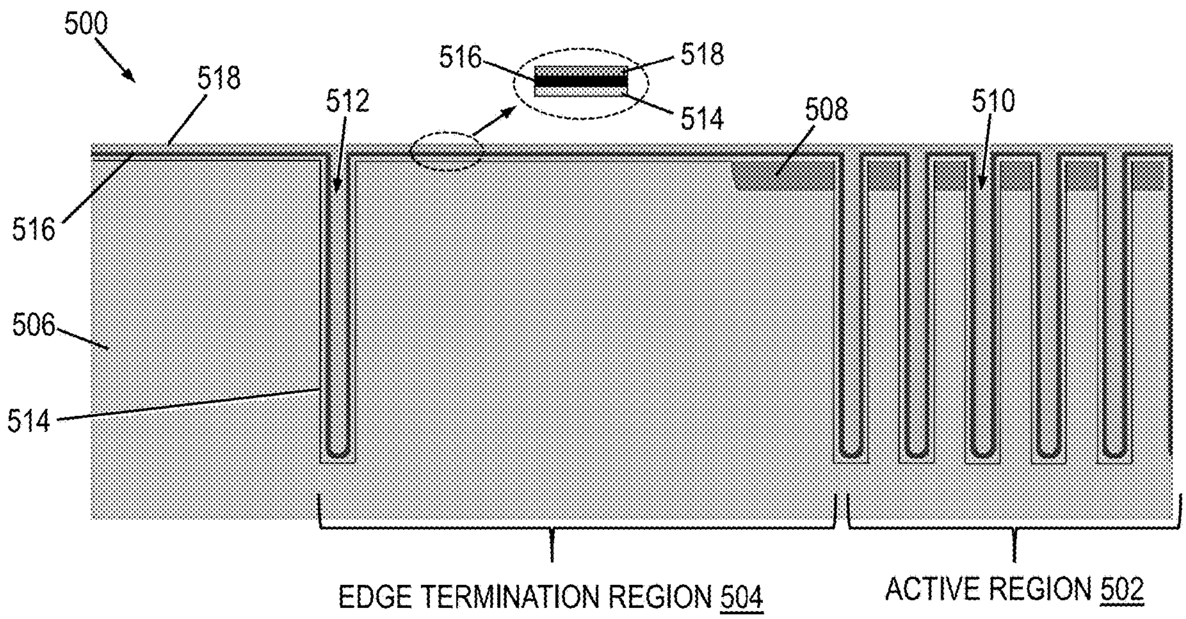

Assuming that after the charged layer 516 is deposited in the trenches 510, 512 in the active and edge terminations regions 502, 504, additional material may be deposited in the trenches so that the trenches are substantially coplanar with the upper surface of the device 500. FIG. 5C illustrates a trench fill process performed for at least partially filling the first plurality of trenches 510, the second plurality of trenches (not explicitly shown), and the one or more outer trenches 512. During the trench fill process, a trench fill layer 518 may be formed on the semiconductor device 500, including at least on an outer (exposed) surface of the charged layer 516 in the first plurality of trenches 510 in the active region 502, as well as on the charged layer 516 in the second plurality of trenches and in the outer trench(es) 512 in the edge termination region 504. The resulting structures may be referred to as active trench structures, corresponding to the trenches 510 in the active region 502, and edge trench structures, corresponding to the second plurality of the trenches (not explicitly shown), and outer trench structure(s) 512 in the edge termination region 504. The trench fill layer 518 may also be formed on an upper surface of the charged layer 516 disposed outside of the trenches, including over the epitaxial layer 506 in the edge termination region 504 and the doped layer 508 in the active region 502 on the mesa areas between adjacent trenches.

It is to be appreciated that, due at least in part to the presence of the insulating layer 514 and the charged layer 516 in the trenches 510, 512, the trench fill process may result in voids being formed in the trenches (not explicitly shown). Furthermore, since the total thickness of the layers in the edge termination region 504 may affect the breakdown voltage in the device (due, at least in part, to fixed charged in the charged layer 516 or a height of a field plate formed on the trench fill layer 518 in the edge termination region 504, it is possible that the trench fill layer 518 may be thinned to a prescribed thickness (e.g., using a planarization process, such as chemical-mechanical polishing (CMP), etching, etc.) or even removed entirely, or an additional layer of insulating or semi-insulating material may be formed to increase the total thickness of the stacked layers disposed on the upper surface of the device 500.

Figure 5D:
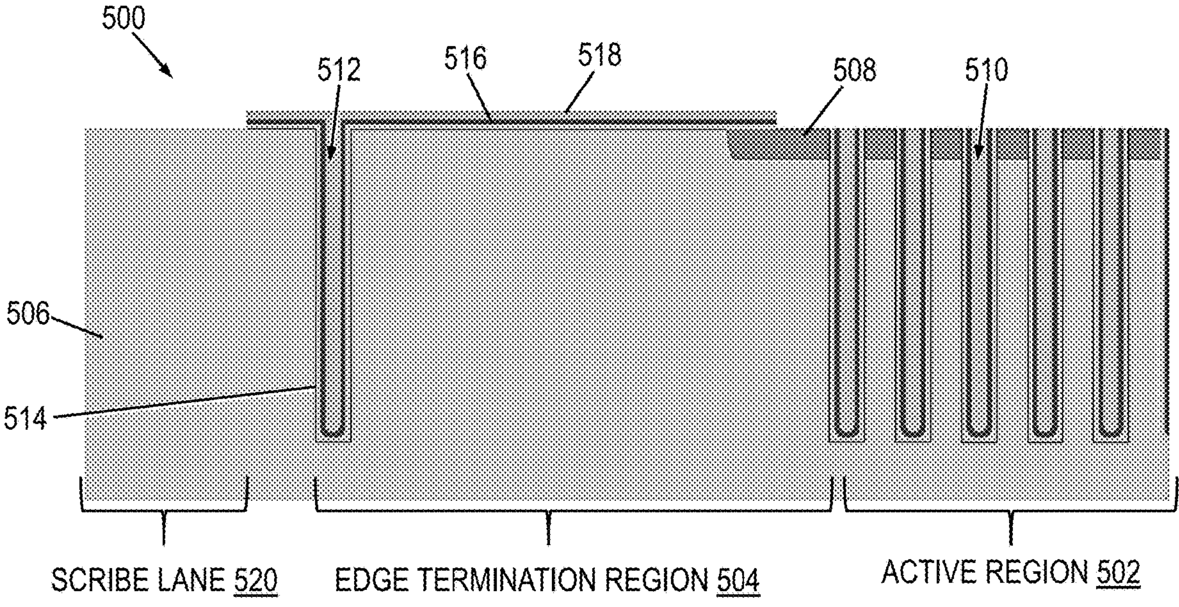

With reference to FIG. 5D, the active region 502 is cleared, or at least partially cleared, of all deposited layers (e.g., films) over the doped layer 508, including portions of the insulating layer 514, charged layer 516, and fill material layer 518 in the active region 502. This may be achieved, for example, using photolithographic patterning and etching selective to the materials being etched. By removing these layers (514, 516, 518) from the upper surface of the device 500 in at least a portion of the active region 502, above the doped layer 508, additional processing of the active device can be performed, such as, but not limited to, forming a Schottky barrier for a Schottky diode.

In FIG. 5D it is shown that the layers 514, 516, 518 on the upper surface of the device 500 outside of the trenches in the edge termination region 504 may also be at least partially removed (i.e., scaled back) in an edge portion of the die, which may be referred to as a scribe lane 520. This process can provide a path for dicing/singulating the die. Although removing the insulating layer 514, charged layer 516 and fill material 518 from the scribe lane 520 in the edge of the die may be good practice and serves to isolate the edge termination layers from the die edge where a saw may pass, this step is to be considered optional.

Figure 5E:
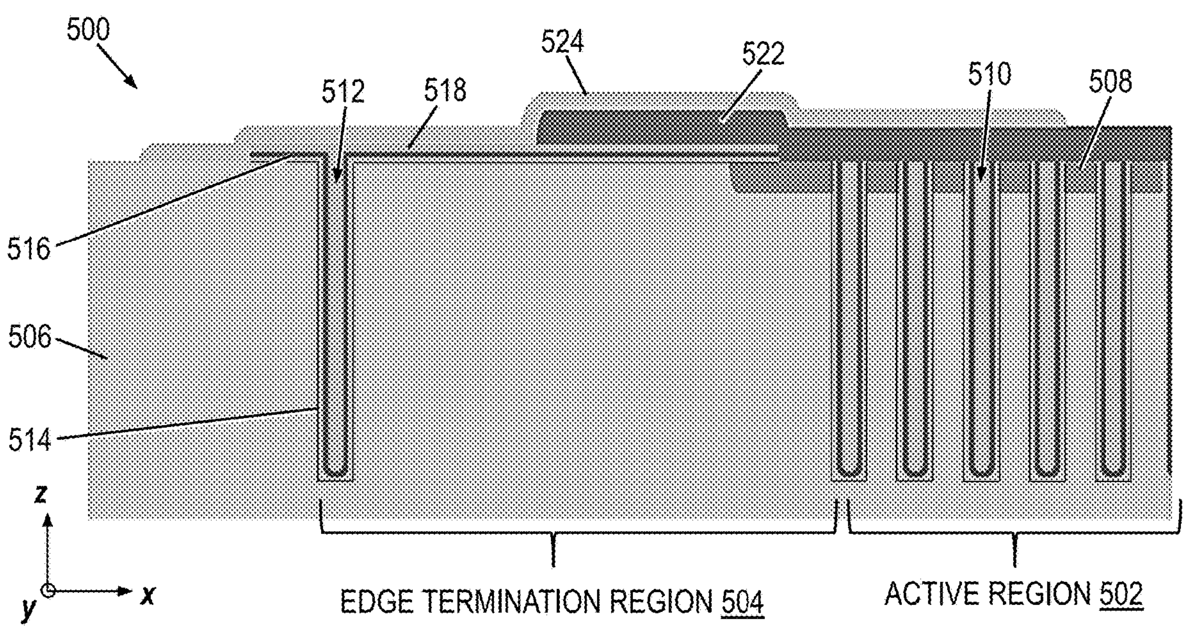

With reference now to FIG. 5E, one or more conductive layers 522 may be formed on at least a portion of the upper surface of the doped layer 508 and trenches 510 in the active region 502. The conductive layer 522, which may be patterned and etched using a standard photolithographic patterning and etching process, may comprise a metal (or alternatively, or in addition to, another conductive material) and provides electrical connection to part of the active device in the active region 502. In one or more embodiments, an end portion of the conductive layer 522 may extend into the edge termination region 504, on at least a portion of the upper surface of the fill material layer 518, to form a field plate. A field plate can beneficially help reduce the maximum electric field and achieve a prescribed electrical field profile across a defined region, and thereby increase a breakdown voltage of the IC device. As previously stated, a height (in the z direction) of the field plate above the upper surface of the device 500 may be a critical dimension in controlling the breakdown voltage in the device. Therefore, in one or more embodiments the respective thicknesses of the insulating layer 514, charged layer 516 and/or trench fill layer 518, on which the conductive layer 522 forming the field plate is disposed, are preferably configured to control an electric field profile in the device 500 as desired.

In some embodiments, a further optional passivation layer 524 may be formed over the upper of the device 500, including on at least a portion of the epitaxial layer 506 in the edge termination region 502, the outer trench structure(s) (512) and the edge trench structures (not explicitly shown in FIG. 5E) in the edge termination region, and the conductive layer 522 in the edge termination and active regions 504, 502. The passivation layer 524 may comprise, for example, silicon dioxide ($SiO_2$), silicon nitride (SiN), silicon oxynitride (SiON), polymide (PI), polybenzoxazole (PBO), or any combination thereof, although embodiments of the invention are not limited to these specific materials. In one or more embodiments, a charged layer (e.g., alumina) may be used as the surface passivation layer 524 to provide charge balancing in the edge termination region 504 of the semiconductor device 500.

In some embodiments, additional process steps may be performed in order to control the electric field profile in the semiconductor device 500, and thus improve breakdown voltage characteristics of the device. By way of example and without limitation, FIGS. 6 through 14 depict alternative and/or additional intermediate processes that may be performed to control one or more electrical properties of the semiconductor device, according to various illustrative embodiments of the invention.

Figure 6:
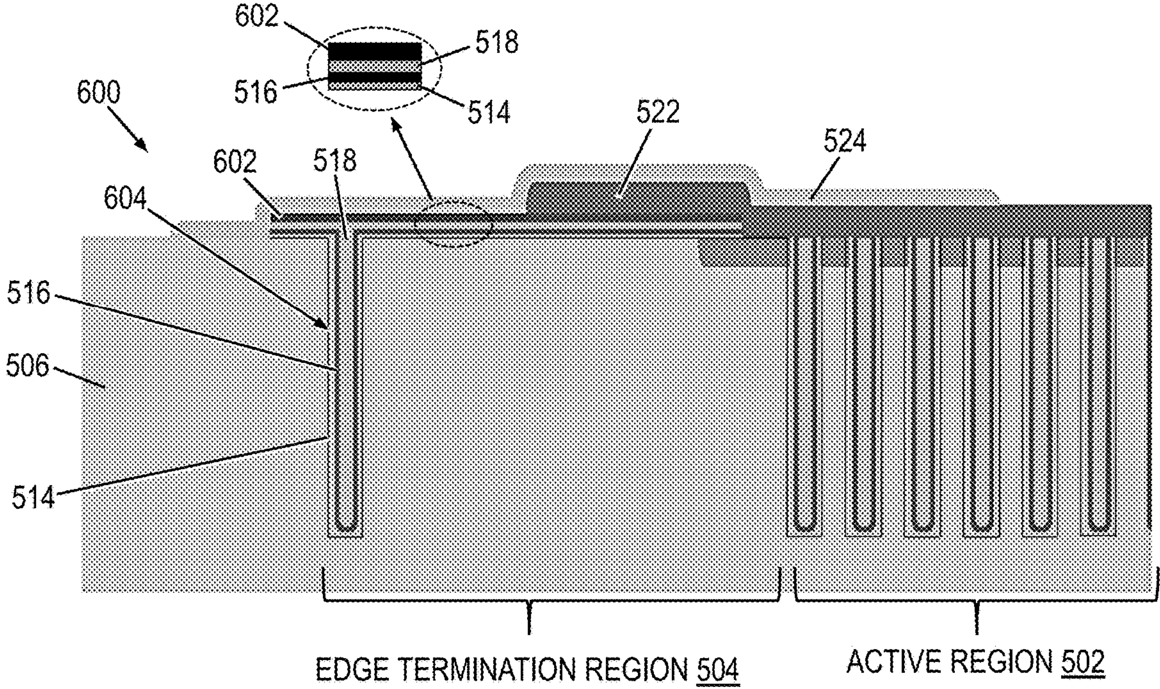
FIGS. 6 through 14 depict alternative and/or additional intermediate processes that may be performed in exemplary fabrication methods for controlling one or more electrical properties of an edge termination structure in a semiconductor device, according to illustrative embodiments of the present invention.

As previously stated in conjunction with FIG. 5E, a height (in the z direction) of the field plate (formed by conductive layer 522) above the upper surface of the semiconductor device 500 can be selectively configured to control an electric field distribution profile in the edge termination region 504 of the device by modifying the respective thicknesses of the insulating layer 514, charged layer 516 and/or trench fill layer 518 on which the field plate is disposed. FIG. 6 is a cross-sectional view depicting at least a portion of an exemplary semiconductor device 600 that shows an alternative approach for configuring the height of the field plate above the upper surface of the device, according to one or more embodiments of the invention.

With reference to FIG. 6, a second insulating layer 602 (or semi-insulating layer) may be formed on at least a portion of the upper surface of the trench fill layer 518 in the edge termination region 504. In one or more embodiments, the second insulating layer 602 may comprise an oxide (e.g., silicon dioxide), although the inventive concept is not limited to any specific insulating or semi-insulating material(s). This approach may be used, for example, when a desired height of the field plate (formed by conductive layer 522) above the upper surface of the device 600 is greater than an overall cross-sectional thickness of the stacked structure including the insulating layer 514, charged layer 516 and trench fill layer 518. The second insulating layer 602, being arranged to cover the edge termination region 504, may provide additional protection for the surface of the device 600 from contamination, among other benefits.

Although the second insulating layer 602 is depicted in the illustrative embodiment of FIG. 6 as being disposed under a portion of the conducting layer 522 over the edge termination region 504 and extending laterally (i.e., in the x direction) over the outer trench structure 604, it is to be appreciated that the second insulating layer 602, in some embodiments, need not extend over the entire edge termination region 504, but rather may be aligned with an edge of the conductive layer 522, or may otherwise end at any point beyond the edge of the conductive layer 522 but before the outer trench structure 604 in the edge termination region 504.

Figure 7:
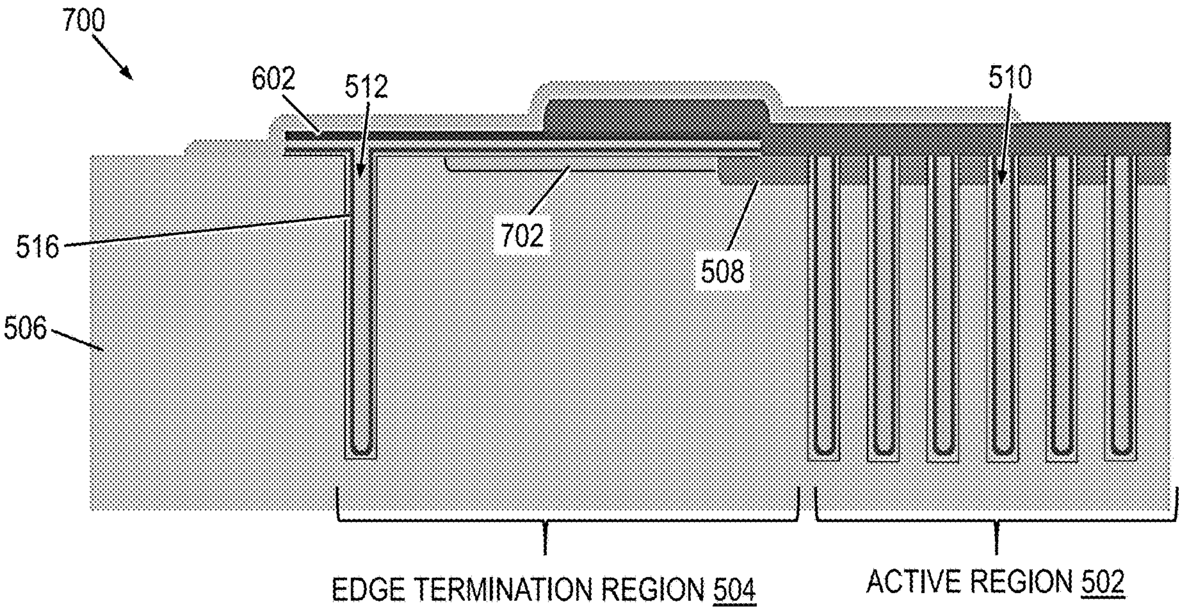
Figure 8:
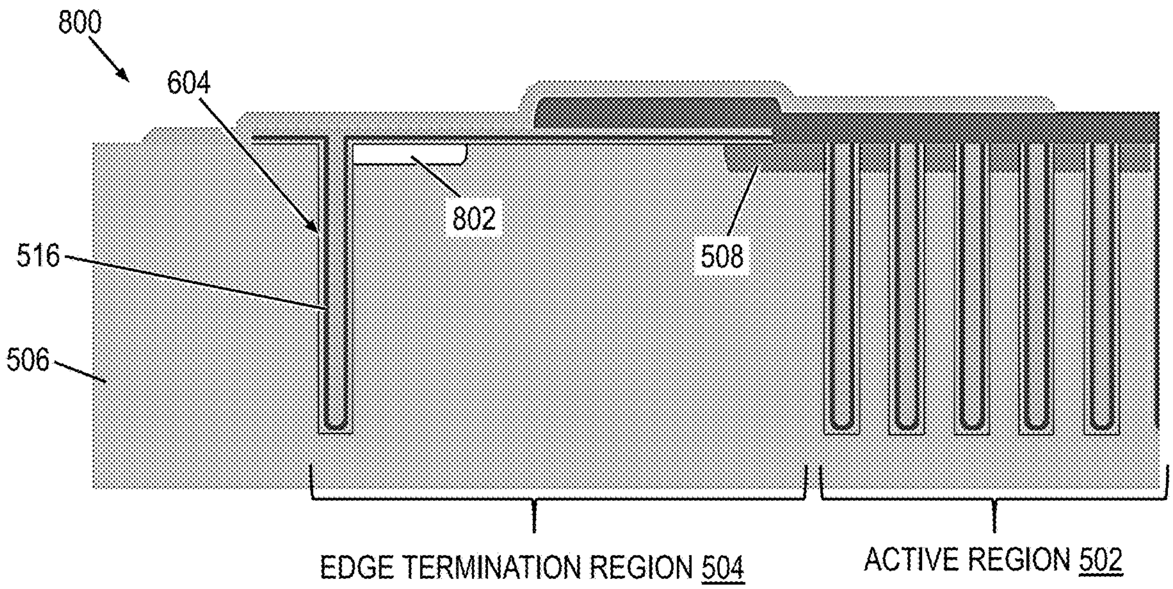

FIG. 7 is a cross-sectional view depicting at least a portion of an exemplary semiconductor device 700 that shows the addition of an implant layer in the edge termination region 504 of the illustrative semiconductor device 600 shown in FIG. 6, according to one or more embodiments of the invention. Specifically, the semiconductor device 700 preferably includes a p-type implant layer 702 formed in the epitaxial layer 506 in the edge termination region 504, proximate the upper surface of the epitaxial layer 506 and laterally adjacent to the doped layer 508 at an end of the active region 502. In some embodiments, the implant layer 702 may be formed as a JTE, although embodiments of the invention are not limited to any specific implant process. In this illustrative embodiment, a p-type implant layer 702 may be used, but it is to be understood that embodiments of the inventive concept are not limited thereto. For example, in some embodiments, an n-type implant layer may be used, or a combination of n-type and p-type implants may be employed, depending on material used to form the epitaxial layer and/or the configuration of the charged layer 516, among other factors.

It is to be appreciated that implants (e.g., implant layer 702) can be configured to either enhance (i.e., increase) the effect of the charged layer 516 (or charges in one or more other layers in the device) in a selected region or regions, or to counteract (i.e., decrease) the effect of the charged layer 516 (or charges in one or more other layers in the device). Thus, for an n-type epitaxial layer 506, a p-type implant layer 702 might be configured to enhance the effect of the charged layer 516. Similarly, in order to counteract the effect of the charged layer 516 using an n-type epitaxial layer 506, an n-type implant layer 802 may be used, disposed towards the end of the edge termination region 504 opposite the active region 502 (e.g., adjacent to the outer trench structure 604), as depicted in the exemplary semiconductor device 800 of FIG. 8. Although not explicitly shown, it is further contemplated that a combination of p-type and n-type implant layers/regions may be used to create a plurality of zones within the edge termination region 504 having varying levels of net charge, according to some embodiments.

The stacked trench film structure comprising the insulating layer 514, charged layer 516 and trench fill layer 518 (and may further include a second insulating (or semi-insulating) layer 602 as shown in FIG. 6) may be formed so as to cover the entire edge termination region 504, as evident in the exemplary semiconductor device 500 shown in FIG. 5E. However, in some embodiments this stacked trench film structure may be etched so that the charged layer 516 does not extend the full length of the edge termination region 504.

Figure 9:
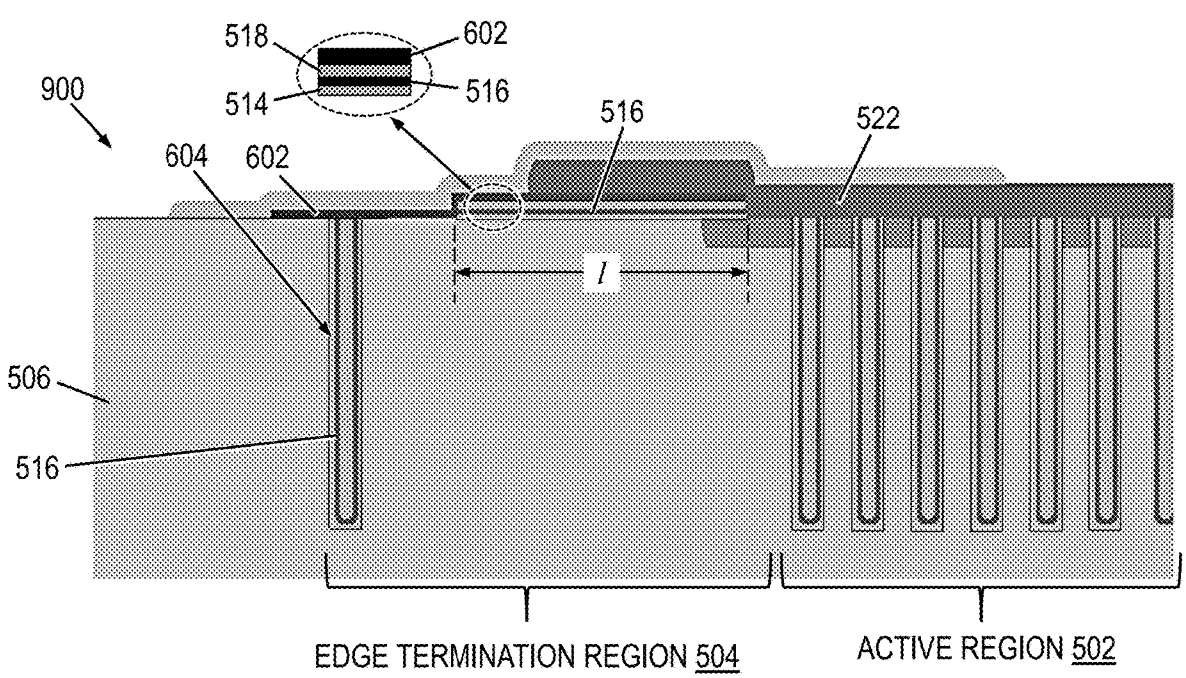

For example, FIG. 9 is a cross-sectional view depicting at least a portion of an exemplary semiconductor device 900 that shows a trench film structure extending less than a full length of the edge termination region 504, according to one or more embodiments of the invention.

Specifically, the illustrative semiconductor device 900 includes a trench film structure that includes the insulating layer 514, charged layer 516, trench fill layer 518, and the second insulating (or semi-insulating) layer 602 formed on the upper surface of the epitaxial layer 506 in a stacked arrangement in the edge termination region 504. The trench film structure may be disposed adjacent to and substantially co-planar with the conductive layer 522 and extends laterally (in the x direction) a prescribed length, l, over the edge termination region 504, where l is less than a full length of the edge termination region 504. A full length of the edge termination region 504 may be defined as the length from an end of the active region 502 extending laterally to at least the end of the outer trench 604.

The amount of charge in the edge termination region 504 may be selectively controlled as a function of the length l of the charged layer 516. This edge termination scheme may be used when a reduction in charge at the end of the edge termination region 504 (proximate the outer trench structure 604) is desired. In this regard, the edge termination scheme conceptually depicted in FIG. 9 has a similar effect of controlling the charge in the edge termination region as the scheme previously described in conjunction with FIGS. 7 and 8.

With continued reference to FIG. 9, although the charged layer 516 has been etched back so that it does not extend over the full length of the edge termination region 504, it may still be beneficial, in some embodiments, to extend the second insulating layer 602 the full length of the edge termination region 504, over the outer trench structure 604. Configured in this manner, the second insulating layer 602 will exhibit a stepped portion which covers a sidewall (i.e., an edge) of the trench film structure, opposite the active region 502, and the remaining portion of the edge termination region 504 beyond the length l of the charged layer 516 (including over the outer trench structure 604). This extension of the second insulating layer 602 may provide additional protection for the surface of the semiconductor device 900.

Figure 10:
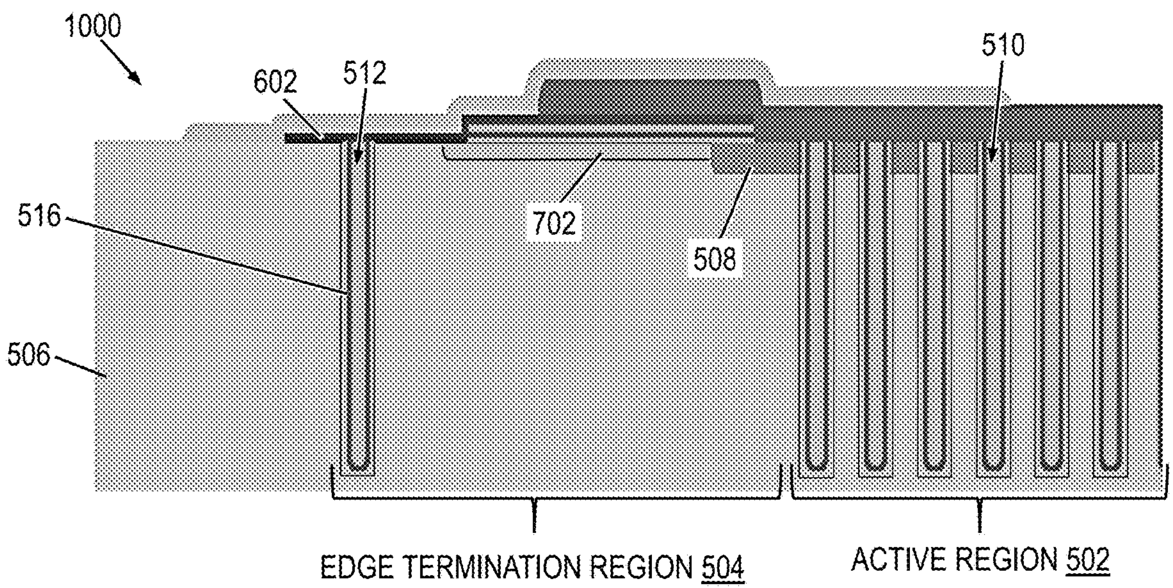

FIG. 10 is a cross-sectional view depicting at least a portion of an exemplary semiconductor device 1000, according to one or more embodiments of the invention. The device 1000 is essentially the same as the illustrative device 900 shown in FIG. 9, with the addition of an implant layer in the edge termination region 504. Specifically, the device 1000 combines the etched back trench film structure (including the insulating layer 514, charged layer 516, trench fill layer 518, and the second insulating (or semi-insulating) layer 602) with the implant layer 702 shown in FIG. 7. For an n-type epitaxial layer 506, the implant layer 702 may be formed as a p-type implant layer in the epitaxial layer 506 in the edge termination region 504, proximate the upper surface of the epitaxial layer 506 and laterally adjacent to the doped layer 508 at an end of the active region 502. As in the device 700 of FIG. 7, the implant layer 702 may be formed as a JTE, although embodiments of the invention are not limited to any specific implant process. The effect of the implant layer 702 on the charged layer 516 may be selectively controlled as a function of one or more properties of the implant layer, including type, polarity and/or concentration level of dopant in the implant layer, extension of the implant layer in the edge termination region 504, depth of the implant layer in the epitaxial layer 506, etc.

Figure 11:
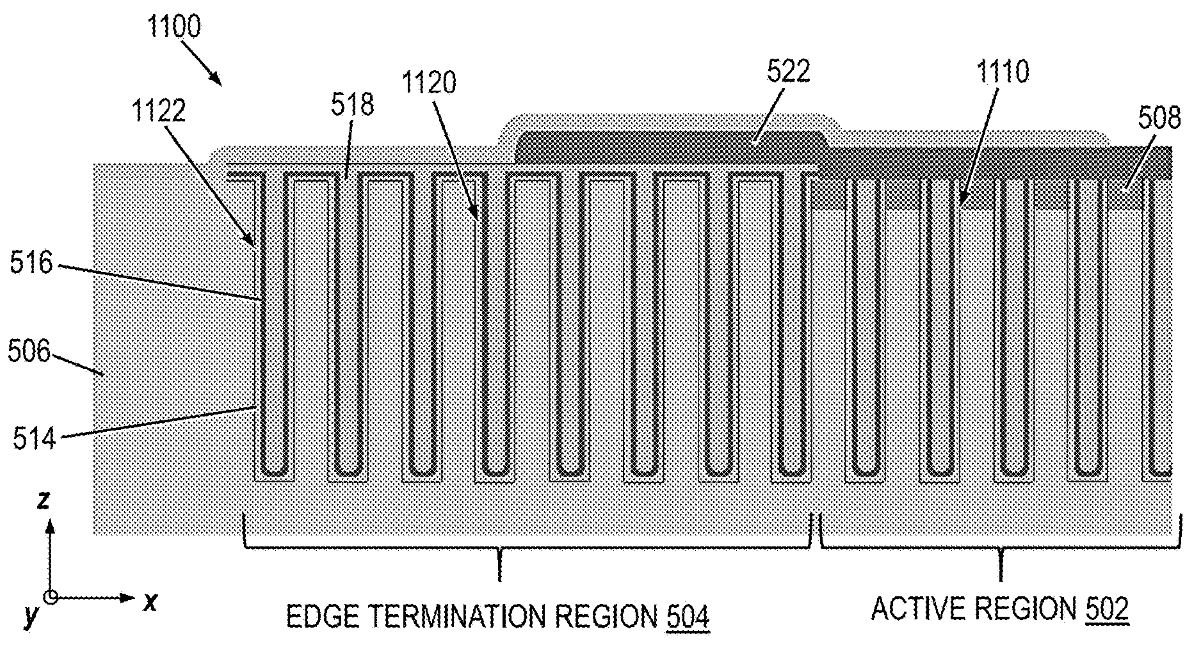

In FIG. 11, a cross-sectional view depicts at least a portion of an exemplary semiconductor device 1100 including a plurality of edge trench structures formed in parallel with a plurality of active trench structures, according to one or more embodiments of the invention. Specifically, the semiconductor device 1100 may include a first plurality of active trench structures 1110 formed through the doped layer 508 at least partially through the epitaxial layer 506 in the active region 502 in a substantially vertical direction (i.e., z direction). The device 1100 may further include a second plurality of edge trench structures 1120 formed at least partially through the epitaxial layer 506 in the edge termination region 504. At least one outer trench structure 1122 may also be formed in the edge termination region 504, the outer trench structure marking an end of the edge termination region 504. As previously stated, the outer trench structure 1122 may be optional, and therefore may be omitted some embodiments.

In the semiconductor device 1100 shown in FIG. 11, in contrast to the exemplary device 300 shown in FIG. 3, each of the edge trench structures 1120 may be configured to extend in a y direction, perpendicular to the x direction, parallel to the active trench structures 1110. Each of the edge trench structures 1120 and outer trench structure 1122 in the edge termination region 504 is formed in the same manner as the active trench structures 1110 in the active region 502, and may include an insulating layer 514, a charged layer 516 and a trench fill layer 518 sequentially stacked on one another in the trenches. In the edge termination region 504, the same stacked structure including layers 514, 516, 518 may be formed in mesas on the upper surface of the device 1100 between adjacent edge trench structures 1120, and between the outer trench structure 1122 and a last one of the edge trench structures 1120.

It is to be appreciated that although the edge trench structures 1120 and outer trench structure 1122 in the device 1100 may be formed using the same materials and during concurrent processing steps as the active trench structures 1110, the respective pluralities of trench structures in the active and edge termination regions 502, 504 may be configured differently relative to one another, at least in terms of size and arrangement, such as, for example, trench width, trench depth, spacing between adjacent trench structures, etc.

Figure 12:
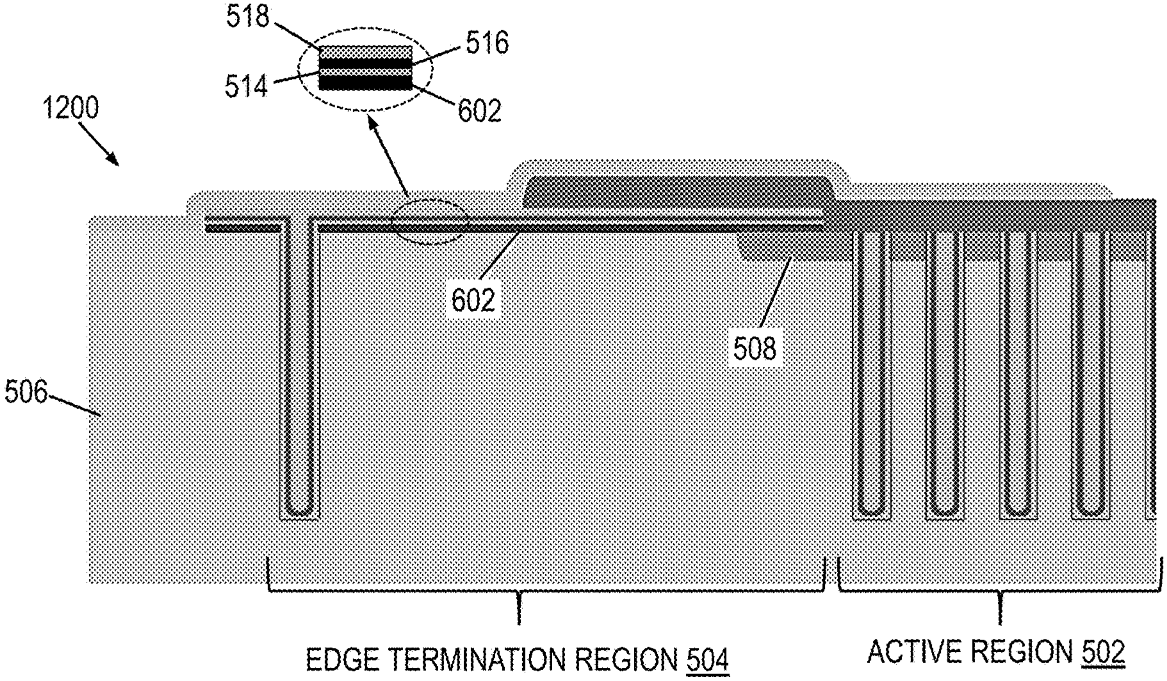

In some embodiments, it may be beneficial for the oxide thickness below the charged layer 516 to be thicker than what is needed in the deep trenches, in which case an additional insulating layer maybe included in the edge termination region 504 by depositing and/or growing an insulating layer on at least a portion of the upper surface of the epitaxial layer 506 in the edge termination region 504, as shown in FIG. 12. Specifically, FIG. 12 is a cross-sectional view depicting at least a portion of an exemplary semiconductor device 1200 that includes the second insulating layer 602 formed on the upper surface of the epitaxial layer 506 in the edge termination region 504, prior to the deep trench etch used to form the trenches in the active and edge termination regions 502, 504 of the device. Once the second insulating layer 602 has been formed, such as by an oxide growth or deposition process, the deep trench etch may be performed followed by formation of the stacked layers within the trenches (e.g., insulating layer 514, charged layer 516 and trench fill layer 518 in a manner previously described.

The cross-sectional thickness of the second insulating layer 602, disposed between the charged layer 516 and the silicon in the epitaxial layer 506, may be beneficially modified to selectively control the amount of charge in the charged layer 516, in accordance with one or more aspects of the inventive concept.

If there is a prior oxide remaining on the surface in the edge termination region 504, which may be due, for example, to prior process steps (e.g., hard mask used for trench oxide, or to protect the edge termination region 504 from other process steps such as implants), it may be beneficial to retain the residual oxide layer(s) in the edge termination region 504 (not explicitly shown, but implied) and reuse this layer(s) to increase the total thickness of the edge termination structure, if needed. Alternatively, the residual oxide layer in the edge termination region 504 may be only partially removed, if the thickness of the residual oxide layer is too great.

Figure 13:
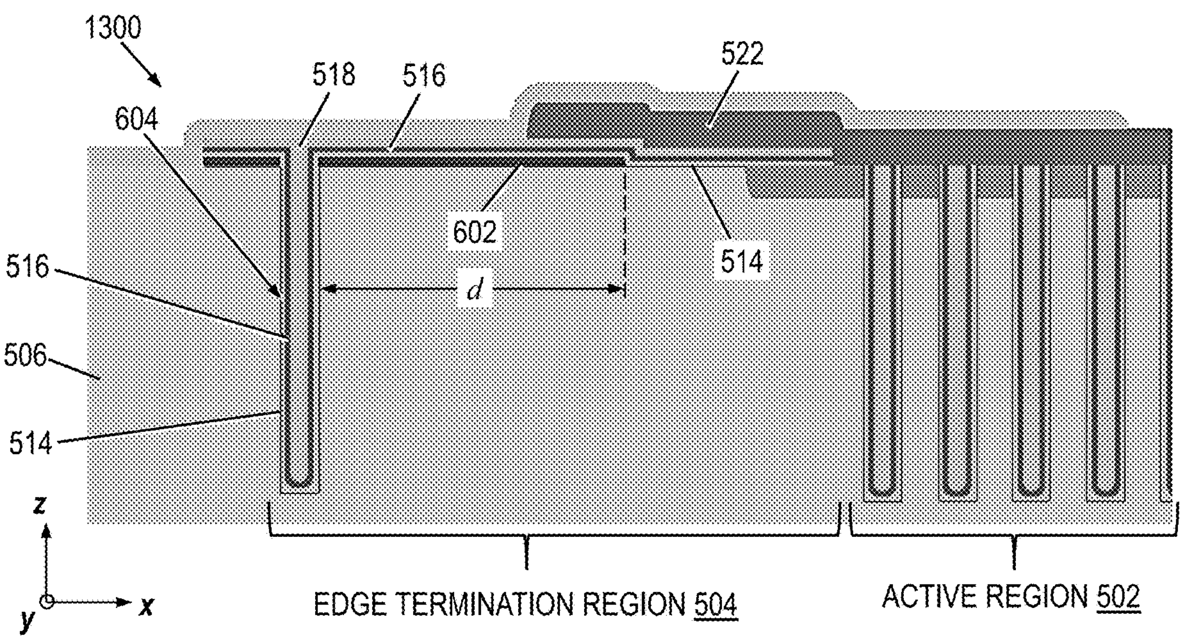

FIG. 13 is a cross-sectional view depicting at least a portion of an exemplary semiconductor device 1300 including an additional insulating layer below the charged layer in a portion of the edge termination region, according to one or more embodiments. This concept is consistent with the formation of the second insulating layer 602 under the charged layer 516 in the illustrative semiconductor device 1200 shown in FIG. 12, except that the second insulating layer 602 does not extend across the full edge termination region 504, but rather extends laterally (in the x direction) from the outer trench structure 604 a distance, d, towards the active region 502, where d is less than the full length of the edge termination region 504 in the x direction. This configuration of the second insulating layer 602 will create a stepped field plate structure (formed from the conductive layer 522), which can help to optimize the breakdown voltage or to selectively control the charge across the length of the edge termination region 504 in the device 1300.

Figure 14:
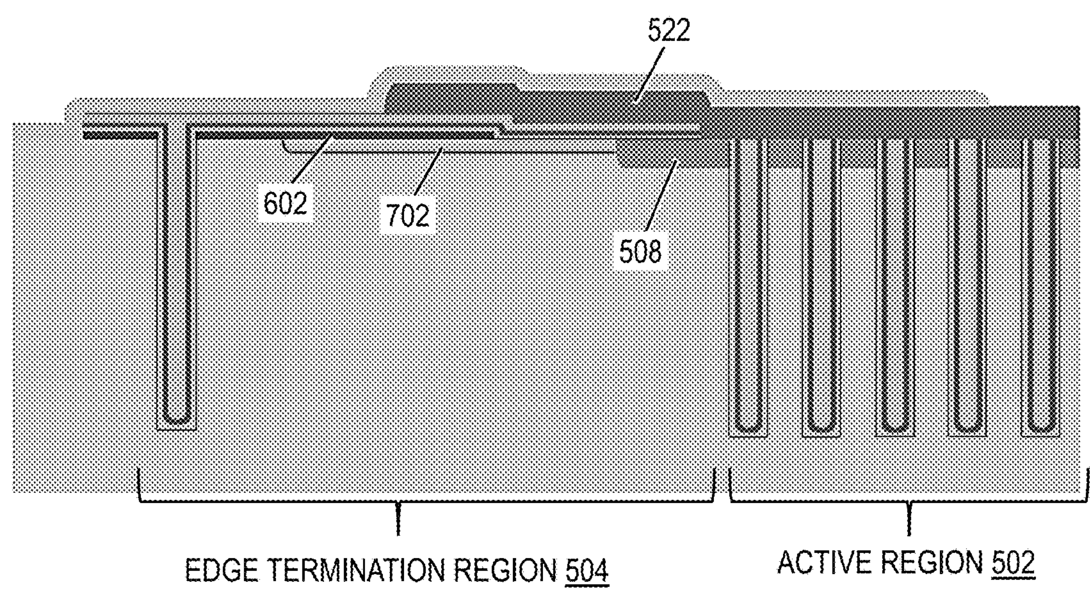

FIG. 14 is a cross-sectional view depicting at least a portion of an exemplary semiconductor device 1400, according to one or more embodiments. The exemplary device 1400 is consistent with the illustrative device 1300 of FIG. 13, except that the device 1400 shown in FIG. 14 combines the arrangement of the second insulating layer 602 partially over the edge termination region 504 with the implant layer 702 introduced in FIG. 7. The implant layer 702 may be formed in the upper surface of the epitaxial layer, adjacent to the doped layer 508, and extends laterally (in the x direction) at least partially across the edge termination region 504. The implant layer 702 may be formed as a JTE, although embodiments of the invention are not limited thereto.

Although various alternative configurations of the edge termination region in the semiconductor device have been described with reference to FIGS. 6 through 14, it will become apparent to those skilled in the art given the teachings herein that numerous other edge termination arrangements can be formed that are within the scope of the inventive concept. Accordingly, the specification and figures are to be regarded in an illustrative rather than a restrictive sense, and all such modifications are intended to be included within the scope of the appended claims. Any benefits, advantages, or solutions to problems that are described herein with regard to a specific example are not intended to be construed as a critical, required, or essential feature or element of any or all the claims.

Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to those having ordinary skill in the relevant arts given the teachings herein. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are both hereby incorporated herein by reference in their entireties for all purposes. It is emphasized that while some individual processing steps are set forth herein, those steps are merely illustrative, and one skilled in the art may be familiar with several equally suitable alternatives that would also fall within the scope of the invention.

It is to be appreciated that the various layers and/or regions that may be shown in the accompanying figures are not necessarily drawn to scale. Furthermore, one or more semiconductor layers of a type commonly used in fabricating such semiconductor devices may not be explicitly shown in a given figure to facilitate a clearer description. This does not imply that the semiconductor layer(s) not explicitly shown are omitted in the actual device.

In one or more embodiments, formation of the exemplary device structures described herein may involve deposition of certain materials and layers by physical vapor deposition (PVD), CVD, atomic layer deposition (ALD), molecular beam epitaxy (MBE), or any of the various modifications thereof, including, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In one or more embodiments, formation of a layer can be achieved using a single deposition process or multiple deposition processes, where, for example, a conformal layer is formed by a first process (e.g., ALD, PE-ALD, etc.) and a fill is formed by a second process (e.g., CVD, electrodeposition, PVD, etc.); the multiple deposition processes can be the same or different.

As used herein, the term "semiconductor" may refer broadly to an intrinsic semiconductor material that has been doped, that is, into which a doping agent has been introduced, giving it different electrical properties than the intrinsic semiconductor material, or it may refer to intrinsic semiconductor material that has not been doped. Doping may involve adding dopant atoms to an intrinsic semiconductor material, which thereby changes electron and hole carrier concentrations of the intrinsic semiconductor material at thermal equilibrium. Dominant carrier concentration in an extrinsic semiconductor material generally determines the conductivity type of the semiconductor material.

The term "metal," as used herein, is intended to refer to any electrically conductive material, regardless of whether the material is technically defined as a metal from a chemistry perspective or not. Thus "metals" as used herein will include such materials as, for example, aluminum, copper, silver, gold, etc., and will further include materials such as, for example, graphene, germanium, gallium arsenide, highly-doped polysilicon (commonly used in most MOSFET devices), etc. This is to be distinguished from the definition of a "metal" from a physics perspective, which usually refers to those elements having a partially filled conduction band and having lower resistance toward lower temperature.

As used herein, the term "insulating" may generally denote a material having a room temperature conductivity of less than about $10^{-10}$ $(\Omega\text{-m})^{-1}$. Suitable insulating materials may include, but are not limited to, silicon oxide, silicon nitride, silicon oxynitride, boron nitride, high-dielectric constant (high-k) materials, or any combination of these materials. Non-limiting examples of high-k materials may include, for example, metal oxides, such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, ceramics, etc. High-k materials may further include dopants such as lanthanum, aluminum, etc.

As used herein, "p-type" may refer broadly to the addition of impurities to an intrinsic semiconductor material that creates deficiencies of valence electrons, such that majority charge carriers may be holes (i.e., positive charge). In a silicon-containing material, non-limiting examples of p-type dopants (i.e., impurities) may include boron, aluminum, gallium and indium.

As used herein, "n-type" may refer broadly to the addition of impurities that contribute free electrons to an intrinsic semiconductor material (i.e., negative charge). In a silicon-containing material, non-limiting examples of n-type dopants may include antimony, arsenic and phosphorous.

It will also be understood that when an element such as a layer, region or substrate is referred to as being "atop," "above," "on" or "over" another element, it is broadly intended that the element be in direct contact with the other element or intervening elements can also be present. In contrast, when an element is referred to as being "directly on" or "directly over" another element, it is intended that there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present. Furthermore, positional (i.e., directional) terms such as "above," "below," "upper," "lower," "under," and "over" as may be used herein, are intended to indicate relative positioning of elements or structures to each other as opposed to absolute position.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having enhanced edge termination structures therein (e.g., power IC devices) formed in accordance with one or more embodiments of the invention.

An integrated circuit in accordance with aspects of the present disclosure can be employed in essentially any application and/or electronic system involving enhanced breakdown voltage structures, such as, but not limited to, power metal-oxide semiconductor field-effect transistors (MOSFETs), Schottky diodes, etc. Suitable systems and applications for implementing embodiments of the invention may include, but are not limited to, AC-DC and DC-DC conversion, motor control, and power supply OR-ing ("OR-ing" is a particular type of application that parallels multiple power supplies to one common power bus in a redundant power system architecture). Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the structures and semiconductor fabrication methodologies described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not necessarily drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, steps, operations, elements, and/or components, but do not preclude the presence or addition of one or more other features, steps, operations, elements, components, and/or groups thereof.

It will be understood that, although the terms "first," "second," etc., may be used herein to describe various elements, these elements should not be limited by such terms. These terms are only used to distinguish one element from another and should not be interpreted as conveying any particular order of the elements with respect to one another. For example, a first element could be termed a second element, and, similarly, a second element could be termed a first element, without departing from the scope of the present disclosure. As may be used herein, the term "and/or" when used in conjunction with an associated list of elements is intended to include any and all combinations of one or more of the associated listed elements. For example, the phrase "A, B and/or C" is intended to include: A alone; B alone; C alone; A and B but not C; B and C but not A; or A, B and C.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A semiconductor device, comprising:

an epitaxial layer disposed on a semiconductor substrate, the epitaxial layer including an active region, in which at least one active element is formed, and an edge termination region, in which at least one edge termination structure is formed, the edge termination region being laterally adjacent to the active region;

a charged layer disposed on an upper surface of the epitaxial layer, the charged layer covering at least a portion of the active region and extending laterally over at least a portion of the edge termination region; and at least one edge trench formed in the edge termination region, the edge trench extending vertically through at least a portion of the epitaxial layer, wherein the charged layer is formed on at least sidewalls of the at least one edge trench.

2. The semiconductor device according to claim 1, further comprising:

a plurality of active trenches formed in the active region, each of the active trenches extending vertically through at least a portion of the epitaxial layer, wherein the charged layer is formed on at least sidewalls of each of the plurality of active trenches.

3. The semiconductor device according to claim 1, wherein the charged layer is formed on the sidewalls of each of the plurality of active trenches and the at least one edge trench using atomic layer deposition in a same processing step.

4. The semiconductor device according to claim 1, further comprising:

a trench fill layer disposed in each of the plurality of active trenches and in the at least one edge trench, the trench fill layer extending onto the upper surface of the epitaxial layer in at least a portion of the edge termination region; and a conductive layer disposed on the upper surface of the epitaxial layer in at least a portion of the active region, the conductive layer being electrically connected to an active device in the active region.

5. The semiconductor device according to claim 4, wherein a height of the conductive layer over the upper surface of the epitaxial layer in the edge termination region is controlled as a function of a cross-sectional thickness of the charged layer and/or the trench fill layer disposed under the conductive layer in the edge termination region to thereby control an electric field distribution profile in the edge termination region.

6. The semiconductor device according to claim 1, wherein the charged layer comprises a material having an inherent fixed charge of a first polarity type, and wherein the epitaxial layer comprises material doped with an impurity of the first polarity type at a prescribed concentration level.

7. The semiconductor device according to claim 1, wherein the charged layer is configured to function as a passivation layer in the semiconductor device.

8. The semiconductor device according to claim 1, wherein the charged layer extends laterally across the edge termination region from the at least one edge trench to an end of the active region adjacent to the edge termination region.

9. The semiconductor device according to claim 1, wherein the charged layer extends laterally over the edge termination region for a prescribed length, the prescribed length being equal to a full lateral length of the edge termination region.

10. The semiconductor device according to claim 1, wherein the charged layer extends laterally over the edge termination region for a prescribed length, the prescribed length being less than a full lateral length of the edge termination region.

11. The semiconductor device according to claim 1, further comprising at least one of a p-type implant layer or an n-type implant layer disposed in an upper surface of the epitaxial layer in the edge termination region, a charge balance in the edge termination region being controlled as a function of a polarity type and dimensions of the p-type implant layer and/or n-type implant layer.

12. The semiconductor device according to claim 1, wherein the charged layer is a stacked film comprising a plurality of material layers, at least one of the plurality of material layers having an intrinsic surface charge associated therewith.

13. A semiconductor device, comprising:

an epitaxial layer disposed on a semiconductor substrate, the epitaxial layer including an active region, in which at least one active element is formed, and an edge termination region, in which at least one edge termination structure is formed, the edge termination region being laterally adjacent to the active region;

a charged layer disposed on an upper surface of the epitaxial layer, the charged layer covering at least a portion of the active region and extending laterally over at least a portion of the edge termination region;

a doped layer in at least a portion of the epitaxial layer in the active region, the doped layer being disposed proximate an upper surface of the epitaxial layer and extending laterally into a portion of the edge termination region; and a first implant layer in at least a portion of the epitaxial layer in the edge termination region, the first implant layer being disposed proximate the upper surface of the epitaxial layer adjacent to an end of the doped layer and extending laterally at least partially across the edge termination region.

14. A method of forming a semiconductor device, the method comprising:

forming an epitaxial layer on a semiconductor substrate, the epitaxial layer including an active region, in which at least one active element is formed, and an edge termination region, in which at least one edge termination structure is formed, the edge termination region being laterally adjacent to the active region;

forming a charged layer on an upper surface of the epitaxial layer, the charged layer covering at least a portion of the active region and extending laterally over at least a portion of the edge termination region; and forming an implant layer in an upper surface of the epitaxial layer in the edge termination region, a charge balance in the edge termination region being controlled as a function of a polarity type and dimensions of the implant layer.

15. The method according to claim 14, further comprising:

forming a plurality of active trenches in the active region, each of the active trenches extending vertically through at least a portion of the epitaxial layer; and forming the charged layer on at least sidewalls of each of the plurality of active trenches.

16. The method according to claim 15, further comprising:

forming at least one edge trench in the edge termination region, the edge trench extending vertically through at least a portion of the epitaxial layer; and forming the charged layer on at least sidewalls of the at least one edge trench.

17. The method according to claim 16, wherein the charged layer is formed on the sidewalls of each of the plurality of active trenches and the at least one edge trench using atomic layer deposition in a same processing step.

18. The method according to claim 16, wherein the at least one edge trench and the plurality of active trenches are formed using a deep trench etch process.

19. The method according to claim 14, wherein the charged layer is formed using atomic layer deposition of a material having an inherent fixed charge of a first polarity type, wherein the epitaxial layer comprises material of the first polarity type.

20. The method according to claim 16, further comprising forming a first insulating layer on at least sidewalls of the at least one edge trench and the plurality of active trenches, the charged layer being disposed on an outer surface of the first insulating layer in the edge and active trenches.

21. The method according to claim 16, further comprising:

forming a trench fill layer in each of the plurality of active trenches and in the at least one edge trench, the trench fill layer extending onto the upper surface of the epitaxial layer in at least a portion of the edge termination region; and forming a conductive layer on the upper surface of the epitaxial layer in at least a portion of the active region, the conductive layer being electrically connected to an active device in the active region.

22. The method according to claim 16, further comprising:

forming a trench fill layer in each of the plurality of active trenches and in the at least one edge trench, the trench fill layer extending onto the upper surface of the epitaxial layer in at least a portion of the edge termination region; and forming a conductive layer on the upper surface of the epitaxial layer in at least a portion of the active region, the conductive layer being electrically connected to an active device in the active region.

23. The method according to claim 22, further comprising controlling a height of the conductive layer over the upper surface of the epitaxial layer in the edge termination region as a function of a cross-sectional thickness of the charged layer and/or the trench fill layer disposed under the conductive layer in the edge termination region to thereby control an electric field distribution profile in the edge termination region.

24. The method according to claim 16, wherein the charged layer extends laterally across the edge termination region from the at least one edge trench to an end of the active region adjacent to the edge termination region.

25. The method according to claim 14, wherein the charged layer extends laterally over the edge termination region for a prescribed length, the prescribed length being equal to a full lateral length of the edge termination region.

26. The method according to claim 14, wherein the charged layer extends laterally over the edge termination region for a prescribed length, the prescribed length being less than a full lateral length of the edge termination region.

27. The method according to claim 14, further comprising:

forming a doped layer in at least a portion of the epitaxial layer in the active region of the semiconductor device, the doped layer being disposed proximate an upper surface of the epitaxial layer and extending laterally into a portion of the edge termination region; and forming a first implant layer in at least a portion of the epitaxial layer in the edge termination region of the semiconductor device, the first implant layer being disposed proximate the upper surface of the epitaxial layer adjacent to an end of the doped layer and extending laterally at least partially across the edge termination region.

28. A method of forming an edge termination structure in a semiconductor device, the semiconductor device including an active region, in which one or more active structures are formed, and an edge termination region, in which the edge termination structure is formed, the edge termination region being laterally adjacent to the active region, the method comprising:

forming an epitaxial layer on a semiconductor substrate, the epitaxial layer extending laterally across the active and edge termination regions;

forming a plurality of active trenches in the active region and at least one edge trench in the edge termination region, each of the at least one edge trench and the plurality of active trenches extending vertically through at least a portion of the epitaxial layer;

forming a first charged layer on at least exposed sidewalls of each of the active trenches and the at least one edge trench in a same processing step; and at least partially filling each of the at least one edge trench and the plurality of active trenches with a fill material in a same processing step to form a trench fill layer.

29. The method according to claim 28, further comprising forming a second charged layer over at least an upper surface of the edge termination region in the semiconductor device, the charged layer functioning as a passivation layer in the semiconductor device.

30. The method according to claim 29, wherein the first and second charged layers are formed in a same processing step.

* * * * *